(12) United States Patent
Ciccotelli

(10) Patent No.: US 11,968,899 B2
(45) Date of Patent: Apr. 23, 2024

(54) METHOD AND DEVICE FOR THE GENERATION OF ELECTRICITY DIRECTLY FROM HEAT

(71) Applicant: Ethan James Ciccotelli, Norwich, VT (US)

(72) Inventor: Ethan James Ciccotelli, Norwich, VT (US)

( * ) Notice: Subject to any disclaimer, the term of this patent is extended or adjusted under 35 U.S.C. 154(b) by 212 days.

(21) Appl. No.: 17/334,776

(22) Filed: May 30, 2021

(65) Prior Publication Data

US 2022/0077372 A1 Mar. 10, 2022

Related U.S. Application Data

(62) Division of application No. 13/762,261, filed on Feb. 7, 2013, now abandoned.

(60) Provisional application No. 61/595,689, filed on Feb. 7, 2012.

(51) Int. Cl.

| | | |
|---|---|---|
| H01L 35/30 | (2006.01) | |
| H02N 11/00 | (2006.01) | |
| H10N 10/13 | (2023.01) | |
| H10N 15/10 | (2023.01) | |
| B82Y 99/00 | (2011.01) | |

(52) U.S. Cl.
CPC ........... *H10N 10/13* (2023.02); *H02N 11/002* (2013.01); *H10N 15/10* (2023.02); *H10N 15/15* (2023.02); *B82Y 99/00* (2013.01)

(58) Field of Classification Search
None
See application file for complete search history.

(56) References Cited

U.S. PATENT DOCUMENTS

| | | | | |
|---|---|---|---|---|
| 3,234,413 | A * | 2/1966 | Schwartz | H10N 15/10 374/177 |
| 3,713,822 | A * | 1/1973 | Kiess | G03G 15/02 430/84 |
| 4,500,397 | A * | 2/1985 | Mori | H01G 7/04 204/488 |
| 4,627,138 | A * | 12/1986 | Im | H10N 30/098 438/50 |
| 2002/0145792 | A1 | 10/2002 | Jacobson | |
| 2005/0150773 | A1 | 7/2005 | Yamada | |
| 2006/0053969 | A1 * | 3/2006 | Harada | H01L 35/14 419/48 |

(Continued)

FOREIGN PATENT DOCUMENTS

| | | | |
|---|---|---|---|
| JP | 2011/148686 | | 12/2011 |
| JP | WO2011148686 | * | 12/2011 |

OTHER PUBLICATIONS

WO2011148686 English translation (Year: 2011).*
WO2011/14868 machine English translation (year: 2011).

*Primary Examiner* — Marcus H Taningco
(74) *Attorney, Agent, or Firm* — Ostrager Chong Flaherty & Broitman P.C.

(57) ABSTRACT

A method and device incorporating the use of Zinc Oxide to generate electrical power directly from heat, with minimal or no complex and inefficient mechanical interventions, by making advantageous use of the abundance and low cost of ZnO and its pyroelectric and thermoelectric properties. ZnO is used as a cheap, under-used material for the purpose of converting thermal energy (heat) directly into usable electricity with none or almost none of the mechanical conversion systems generally in use.

18 Claims, 10 Drawing Sheets

(56) References Cited

U.S. PATENT DOCUMENTS

| | | | |
|---|---|---|---|
| 2006/0263894 A1* | 11/2006 | Carter | G01N 33/54366 |
| | | | 436/149 |
| 2007/0187815 A1 | 8/2007 | Dai | |
| 2008/0223427 A1 | 9/2008 | Ohno | |
| 2009/0185991 A1* | 7/2009 | Spaulding | A61K 8/27 |
| | | | 424/59 |
| 2010/0065754 A1* | 3/2010 | Bromberg | H01J 49/147 |
| | | | 977/939 |
| 2010/0083946 A1 | 4/2010 | Cedar | |
| 2010/0108115 A1 | 5/2010 | Lee | |
| 2010/0147349 A1* | 6/2010 | DiFoggio | E21B 36/04 |
| | | | 136/201 |
| 2011/0260120 A1* | 10/2011 | Tokudome | C01G 9/006 |
| | | | 252/519.1 |
| 2012/0103380 A1 | 5/2012 | Stefan | |
| 2013/0002091 A1* | 1/2013 | Kim | H10N 10/13 |
| | | | 310/306 |
| 2013/0038071 A1* | 2/2013 | Kano | B60L 50/90 |
| | | | 290/1 R |
| 2016/0104831 A1* | 4/2016 | Xu | H10N 15/10 |
| | | | 136/201 |
| 2016/0284964 A1* | 9/2016 | Yamanaka | H10N 15/10 |
| 2019/0051809 A1* | 2/2019 | Zabek | F28D 15/02 |

\* cited by examiner

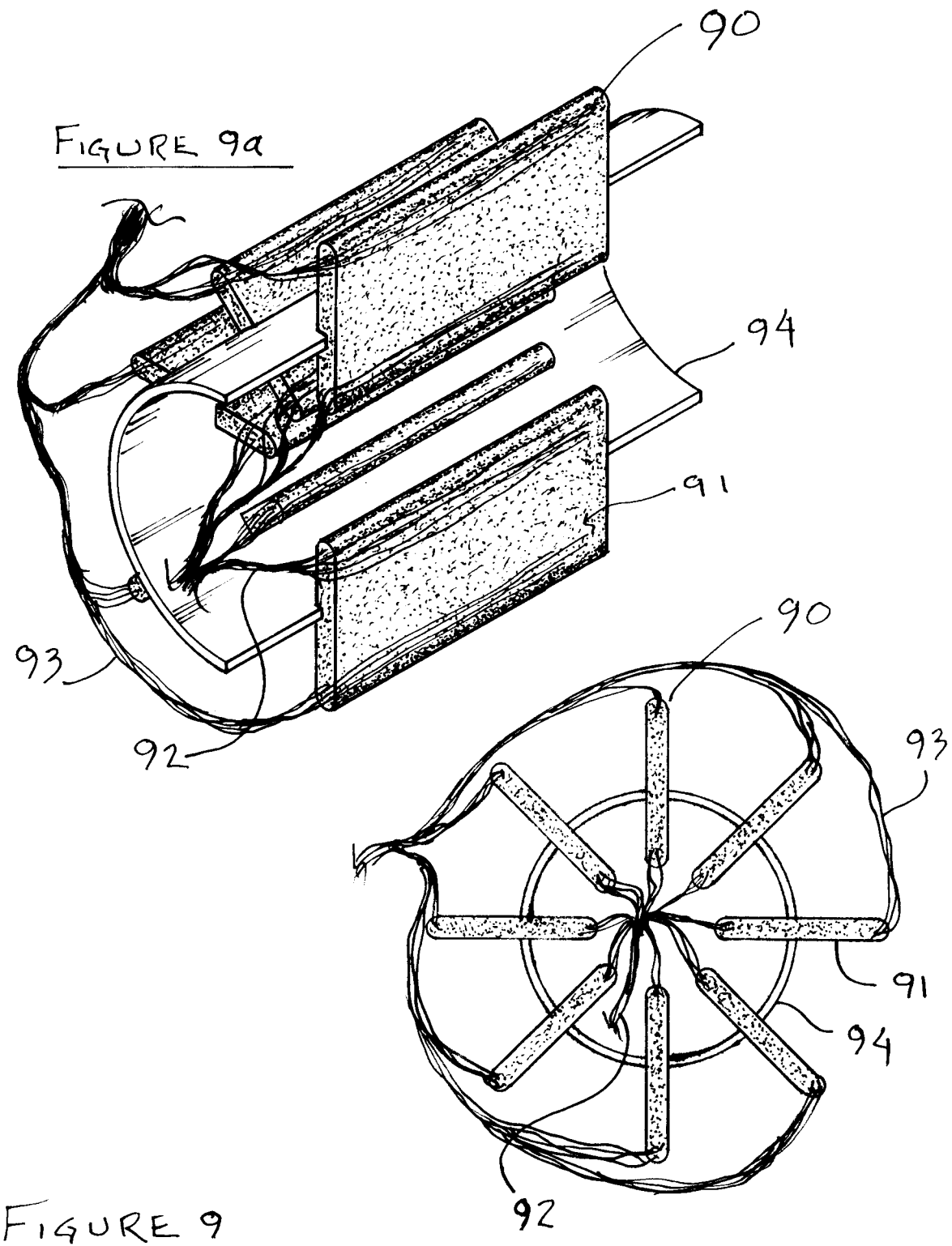

METHOD AND DEVICE FOR THE GENERATION OF ELECTRICITY DIRECTLY FROM HEAT

CROSS-REFERENCE TO RELATED APPLICATION

This application is a divisional application of co-pending U.S. application Ser. No. 13/762,261 filed Feb. 17, 2013, which claims the benefit of U.S. Provisional Application No. 61/595,689 filed Feb. 7, 2012, both prior applications incorporated herein by reference.

THE FIELD OF THE INVENTION

The invention relates to a method and device for the generation of electricity directly from heat incorporating the use of Zinc Oxide (referred to hereinafter as "ZnO").

BACKGROUND OF THE PRESENT INVENTION

ZnO is a metallic oxide of zinc, and possesses three different means of producing electricity. One means by which ZnO produces electrical current is piezoelectric, that is, it produces a voltage when the material is subjected to physical deformation. A second means by which ZnO produces electrical current is pyroelectric, that is, it produces a voltage when it is subjected to a temperature change over a period of time. Another means by which ZnO produces electrical current is thermoelectric, producing a current when it is subjected to a temperature difference across a quantity of the material.

ZnO is an abundant material found in the earth's crust, and is relatively easy to obtain in relatively pure forms compared to other mineral compounds. Due to these two facts, among others, ZnO is very inexpensive and a common component in numerous industrial and commercial products and systems, examples of which would include paint, toothpaste, sunscreen lotions, filler material for plastics, dietary supplements, cosmetics, and many other uses. It is relatively nontoxic to humans, it is biocompatible, and in fact, it is an essential nutrient.

Zinc oxide (ZnO) is a ceramic or ceramic-like material produced from the reaction of zinc with oxygen. It may be in the form of a large, single crystal, or it may be in a polycrystalline form, which is seen macroscopically as a white or yellowish-white powder and under magnification as individual crystals.

In its large, single crystal form, ZnO is extremely costly, and therefore, not very practical or suitable for mass commercialization. On the other hand, polycrystalline ZnO is a very inexpensive material, and is used in many common commercial applications, such as cosmetics, pharmaceuticals, plastics, and numerous other applications.

Regardless of the scale of the ZnO crystal, ZnO possesses pyroelectric, thermoelectric, and piezoelectric properties. ZnO crystals possess at least two crystal structures, wurtzite and zincblende, however, wurtzite is the preferable form of ZnO for generating electrical current or potential.

In general, all pyroelectric materials are piezoelectric materials. However, not all piezoelectric materials are pyroelectric. Moreover, some piezoelectric materials are thermoelectric, as are some pyroelectric materials. For example, carbon nanotubes are thermoelectric; bismuth telluride is thermoelectric; silicon dioxide (quartz) is both pyroelectric and piezoelectric; lead zirconium titanate (PbZiTi, also known as PZT) is piezoelectric and pyroelectric, and polyvinylidine fluoride is a piezoelectric and pyroelectric polymer.

The crystal structure of ZnO is that of an asymmetrical crystal. When the individual crystalline particles of ZnO, either individually or in a mass, are subjected to a strong electrical field, the electrical poles of the particles align with the charge field. When the electrical poles of crystalline particles are in such an aligned state, they are referred to as being "poled".

A ZnO based device is well suited for large scale use. ZnO does not generate large potentials or large currents relative to other materials, but because it is inexpensive, it is suitable for use in large quantities needed for large scale devices and installations. On the other hand, the low cost of polycrystalline ZnO permits it to be used in individual devices of a small scale that are manufactured in mass quantities.

A pyroelectric material generates electricity through changing temperatures of all or a portion of a mass of pyroelectric material over a period of time, such as by causing the mass as a whole heated then cooled, causing the temperature of the mass of ZnO to oscillate over time. Voltage in a pyroelectric system is modeled by the equation $$V = P \frac{d}{\epsilon_r} \frac{\delta T}{\delta t}.$$

Current in a pyroelectric system is modeled by the equation $$I = PA \frac{\delta T}{\delta t}.$$

In both equations, V is voltage, I is current, P is the pyroelectric constant, d is the distance between electrodes, $\epsilon_r$ is the dielectric strength of the pyroelectric material, $$\frac{\delta T}{\delta t}$$

is the change in temperature over the change in time, and A is the electrode area. By utilizing the foregoing equations, one is able to model the performance of a pyroelectric system such as the present invention to, for instance, determine pyroelectric system design parameters, or determine the level of efficiency of a pyroelectric system.

A thermoelectric material generates electricity through a temperature differential across the mass of the device. Thus, where there is enough mass in the device so that the hotter area is isolated enough from the cooler area, for example, with enough distance between the hotter area of the device and the cooler area that the entire mass does not reach temperature equilibrium, the greater the difference in the temperatures between the hotter area of the device and the cooler area of the device due to the greater the mass between the heated surface and the opposing cool surface, the greater the quantity of electricity is produced. Use of a large ZnO mass is advantageous as a thermoelectric material because it is more cost effective than alternative materials used as a thermoelectric material.

Therefore, it will be seen that the present invention provides a system that has as its objective and intention, to generate electrical power directly from heat, with minimal or no complex and inefficient mechanical interventions, by making advantageous use of the abundance and low cost of ZnO and its pyroelectric and thermoelectric properties. The present invention utilizes a cheap, under-used material for the purpose of converting thermal energy (heat) directly into usable electricity with none or almost none of the mechanical conversion systems generally in use.

SUMMARY OF THE INVENTION

The present invention is a system and a method of producing the system to generate electrical voltage, current, or both. The system utilizes a powdered polycrystalline material, such as polycrystalline ZnO, forming the material and affixing to it or embedding into the material, electrically conductive materials that collect and guide the electrical potential or current or both that is produced when the device is heated or cooled.

The system for generating electrical potential or current or both is utilizes a quantity of polycrystalline pyroelectric material that formed into a cohesive mass capable of retaining its volume and shape by means of compression, heat, containment or any combination of the three. The quantity of the polycrystalline pyroelectric material may vary within wide limits, but generally, it should be sufficient for forming, shaping, and maintaining the integrity of the workpiece, or sufficient for applying or affixing the material to a substrate. Using ZnO, for instance, as a polycrystalline pyroelectric material, allows a broad range of scale of the applications of the material, and thus, a broad range of quantities is available. A primary determinant is the scale of the application of the workpiece, as well as the temperatures it will be heated and cooled to, and the speed at which the rise and fall of temperature is required to occur. The cohesive mass of pyroelectric material has at least two electrically conductive elements comprised of materials such as, for example, solid metallic or carbon conductors, wires, fibers, nanotubes, or nanofibers, singly or in any combination, that are affixed to or embedded into at least two opposing regions, surfaces, or facets, of the cohesive mass. The system may be installed in an electrical circuit, conducting or conveying electrical potential or electrical current from one side or facet of said mass of polycrystalline pyroelectric material to the opposite side of said mass through the electrical circuit. The cohesive mass of polycrystalline pyroelectric material and the crystals within it may be given a uniform electrical polarity by immersing the workpiece in an electrical field while simultaneously being heated. Furthermore, the cohesive mass of polycrystalline pyroelectric material may be zinc oxide (ZnO).

The present invention also teaches a system for generating electrical potential or current or both utilizing a quantity of polycrystalline thermoelectric material formed into a cohesive mass capable of retaining its volume and shape by means of compression, heat, containment or any combination of the three. The quantity of the polycrystalline thermoelectric material may vary within wide limits, but generally, it should be sufficient for forming, shaping, and maintaining the integrity of the workpiece, or sufficient for applying or affixing the material to a substrate. Using ZnO, for instance, as a polycrystalline thermoelectric material, allows a broad range of scale of the applications of the material, and thus, a broad range of quantities is available. A primary determinant is the scale of the application of the workpiece, as well as the temperatures one region or end of it will be heated and that the opposing region or end will be cooled to, and the temperature differential that is required between the two regions. The cohesive mass of polycrystalline thermoelectric material has at least two electrically conductive elements comprised of materials such as, for example, solid metallic or carbon conductors, wires, fibers, nanotubes, or nanofibers, singly or in any combination, affixed to or embedded into opposing regions, surfaces, or facets, of the cohesive mass. The system may be installed in an electrical circuit, conducting or conveying electrical potential or electrical current from one side or facet of said mass of polycrystalline thermoelectric material to the opposite side of said mass through said electrical circuit. The cohesive mass of polycrystalline thermoelectric material and the crystals within it may be given a uniform electrical polarity by immersing the workpiece in an electrical field while simultaneously being heated. Furthermore, the cohesive mass of polycrystalline thermoelectric material may be zinc oxide (ZnO).

The present invention also teaches a method for producing a system for generating electrical potential or current or both. The method is comprised of forming a quantity of polycrystalline pyroelectric or thermoelectric material into a cohesive mass capable of retaining its volume and shape by means of compression, heat, containment or any combination of the three. The quantity of the polycrystalline pyroelectric or thermoelectric material may vary within wide limits, but generally, it should be sufficient for forming, shaping, and maintaining the integrity of the workpiece, or sufficient for applying or affixing the material to a substrate. Using ZnO, for instance, as a polycrystalline pyroelectric or thermoelectric material, allows a broad range of scale of the applications of the material, and thus, a broad range of quantities is available. A primary determinant is the scale of the application of the workpiece, as well as whether the system is pyroelectric or thermoelectric. Electrically conductive elements comprised of materials such as solid metallic or carbon conductors, wires, fibers, nanotubes or nanofibers, singly or in any combination are affixed to or embedded into opposing regions, surfaces or facets of said cohesive mass of polycrystalline pyroelectric or thermoelectric material. Heat, pressure, or both are applied to the system until the mass of polycrystalline material is cohesive and consolidated. The system may be given a uniform electrical polarity by immersing the workpiece in an electrical field while simultaneously being heated. The polycrystalline material may be zinc oxide.

BRIEF DESCRIPTION OF THE FIGURES

FIG. 9a is a cut-away perspective view detailing a component part used in an embodiment of the subject system and method.

FIG. 9 is top plan view of a component part used in an embodiment of the subject system and method.

DETAILED DESCRIPTION OF THE PREFERRED EMBODIMENTS

The method to produce the device of the present invention was conducted in the following manner in a preferred embodiment of the present invention. Polycrystalline ZnO in a powder form is mixed with oil, usually linseed oil or safflower oil, but any oil or other material that will plasticize at lower temperatures and either vaporize or combust or both at higher temperatures is adequate for the present invention. The polycrystalline ZnO powder-oil mixture is formed into at least one shaped mass as required by the intended application, and electrical conductors are affixed to or embedded into opposing surfaces of the shaped mass. The electrical conductors may be comprised of metal or metallic filaments wires, ribbons, plates, bars, rods or any other shape suited to the intended application of the invention. A suitable mass may be a lozenge or tablet shape, with dimensions of approximately 1.0 in.×1.0 in.×0.18 in. The electrical conductors may alternatively, be comprised of carbon, carbon fiber, or carbon nanotube material. The electrical conductors may be flexible or rigid. Other materials may also be used for the electrical conductors, although it is preferable that they are able to withstand the heat of the manufacturing process herein described or of the application to which the present invention is put to use.

The powder-oil mix is then heated to a temperature in the range of 212° F. (100° C.) to 3587° F. (1975° C.). The oil mixed with the powder is heated until it is substantially eliminated from the consolidated ZnO mass. The resulting consolidated structure of ZnO powder has a sintered or sintered-like state or consistency. The consolidated structure comprised of ZnO crystals has or should have no or almost no carbon entrained within it. Examples of embodiments incorporating these elements are shown in FIGS. 1, 3, 6, 7 and 9.

Figure 2:
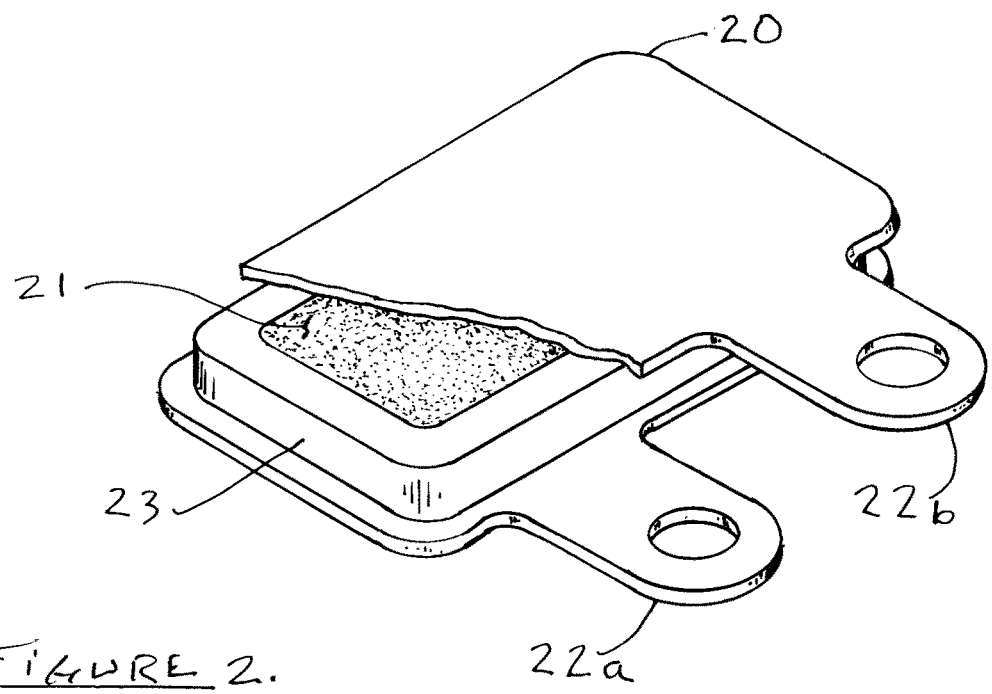
FIG. 2 is a cut-away perspective view detailing a component part used in an embodiment of the subject system and method.
Figure 4:
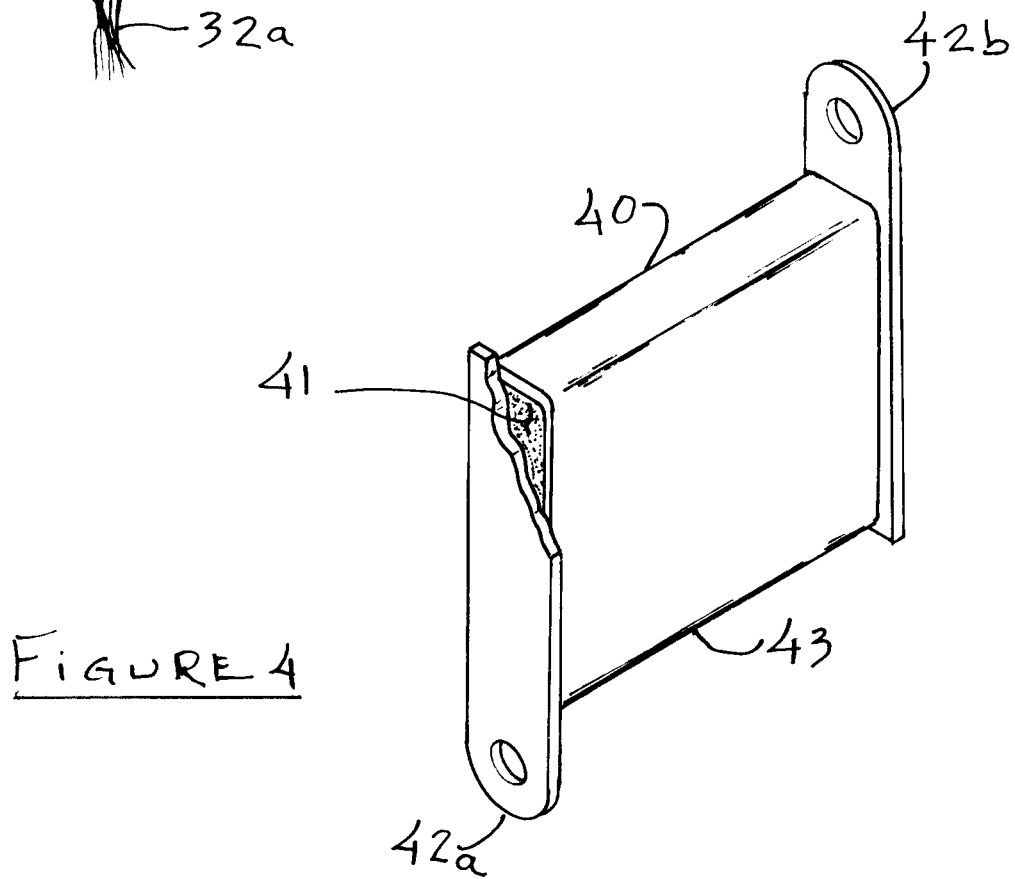
FIG. 4 is a cut-away perspective view detailing a component part used in an embodiment of the subject system and method.
Figure 5:
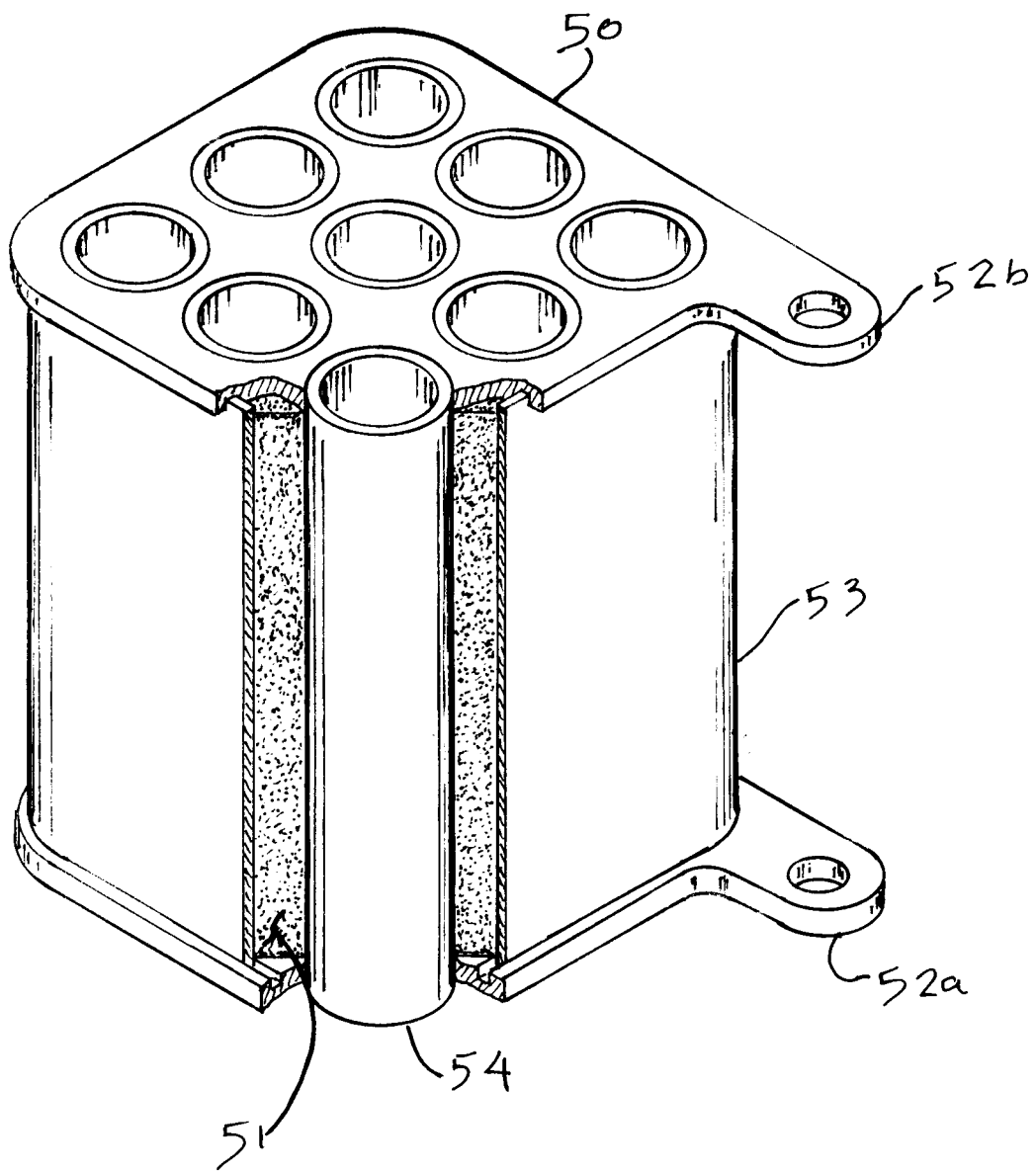
FIGS. 5-8 are cut-away perspective views detailing component parts used in embodiments of the subject system and method.

In another embodiment, the ZnO powder is affixed to the electrically conductive substrates located at approximately opposite positions of the ZnO mass. The material for the substrates may be a metal such as copper, aluminum, silver, or steel, or it may be a composite material of a conductive material, such as a metal-polymer composite, or a metal-ceramic composite. The material must also be capable of withstanding the heat of the manufacturing process and the heat applied to the device to generate electrical current. An embodiment of this type may further be encapsulated by a non-conductive shell of a material capable of withstanding the heat of the manufacturing process and the heat applied to the device to generate electrical current, containing the ZnO powder and electrically conductive substrates. The non-conductive shell locates the substrates and fixes their relationship to each other and the ZnO powder. The material for the non-conductive shell may be, for example, a ceramic, glass, or high temperature polymer. Typically, devices of this embodiment have dimensions of approximately 1.0 in.×1.0 in.×0.18 in., but may also be scaled to be applied to a large scale industrial use, such as scavenging energy from industrial exhaust. Examples of embodiments incorporating these elements are shown in FIGS. 2, 4, and 5.

In a further embodiment of the present invention, the ZnO powder-oil mixture is formed as described above or is affixed to conductive substrates, and then the workpiece so formed is heated while immersed a direct current or non-oscillating electrical field. The workpiece is immersed in the electric field by placing it approximately equidistant between two physically opposed and oppositely electrically charged electrodes creating an electrical field between them. The strength of the electrical field can be in the range of 1000 N/C to 10,000 N/C or greater. In this embodiment, the polarity of the crystals is caused to be parallel and in the same direction among all the crystals, by inserting the crystals into the electrical field during the herein described heating. Moreover, the crystals in this embodiment are caused to retain the same polarization after insertion into and subsequent removal from said electrical field. The crystals are heated to a temperature between approximately 149° C. (300° F.) and 1995° C. (3623° F.) while they are immersed in the electrical field.

In another embodiment of the present invention, ZnO crystals, comprising a powder form material are compounded with an oil based carrier such as that found in paint, are immersed in a strong electrical field while simultaneously subjected to heat of a temperature less than 300° F. until all oil binding the ZnO powder has burned or evaporated completely, and the powder crystals are bound to each other forming a friable solid material.

In another embodiment of the present invention the same method described in the previous paragraph is followed, but with the additional step wherein, after the binding oil has been burned off or evaporated, while the electric field surrounding the material is maintained, the temperature at which the material is being heated is raised further, to a temperature sufficient to cause the ZnO crystal particles to fuse into a mass wherein the particles are solidly fused or melted together thereby forming a solid mass with few or no voids. Alternatively, the crystal particles are less than solidly fused, forming a solid mass in which the crystalline particles are serially communicating with or contacting each other, and the mass includes voids between a portion of the crystalline particles. The portion of the crystalline particles including voids between the particles should be minimized, but may be up to an amount in the range of 7.5% to 15.0% of the whole. The embodiments shown in FIGS. 1 through 8, and 10, which can be described as basic forms of the present invention, are amenable to the treatment described above.

In another embodiment of the present invention, all the steps of the method described above paragraph are followed, but water is substituted for oil, and the temperature of the first step of heating is maintained at a temperature sufficient to evaporate all water, then raised to a temperature sufficient to cause a consolidated structure to form similar to that formed when the ZnO powder-oil mixture is heated.

Another embodiment of the present invention can be produced by forming a rectangular lozenge of the consolidated ZnO material. The lozenge can have dimensions of approximately 1.0 in.×2.0 in.×0.25 in., and can be formed by spreading a layer of ZnO powder and oil mixture onto a metal form which supports the ZnO/oil mixture prior to consolidation.

The electrical conductors, which are comprised of electrically conductive materials including, but not limited to, for example, metal or metallic materials in wire, sheet, or foil forms, for example, or carbon fiber, carbon nano-tubes, or graphene, are affixed to opposing surfaces or embedded into opposing surfaces of the consolidated structure prior to being fired or exposed to heat of a temperature sufficient to as completely as possible burn off or eliminate the oil and other residue from the ZnO consolidated structures.

In an alternate embodiment, the present invention is configured so that current or potential produced by the piezoelectric properties of the ZnO material, that is to say, the current produced by the expansion and contraction of the ZnO material may be utilized either alone, or in combination with current or potential produced by the pyroelectric characteristics of ZnO, with current produced by the thermoelectric characteristics of ZnO, or with current produced by both.

In one embodiment of the present invention heat is applied to one end of a completed ZnO element such as one produced by the means described hereinabove, for example, and is caused to be continuously conducted toward the opposing extremity of said ZnO element. Electrical conductors are affixed to or embedded into the element at the end where the heat is introduced to the element, and at its opposite end. It is preferable that the distance between the ends of the element to which the conductors are affixed or embedded be great enough that the entire element does not reach thermal equilibrium, or alternatively, that the ends be thermally isolated to avoid thermal equilibrium between the ends of the element. A current is caused to be generated when the heat is applied to an end of the ZnO element, so long as there is a difference in temperature between one end of the element and the opposite end. The conductors installed at the ends of the element conduct the current generated thereby, and if the element is installed into a completed electrical circuit, said current can be detected and utilized.

In an embodiment of the present invention, at least one ZnO element is placed within a completed electrical circuit. The element is alternately heated and cooled. When the element is being heated, electrical current flows through the circuit in one direction. When heat is removed and the element is cooling, the current flows through the circuit in the opposite direction.

In one embodiment of the present invention, heat is alternately applied first to one first surface, end, or facet of at least one ZnO element, and then to the opposite, second surface, end, or facet in a repetitive manner. In general, heat may be applied by any heat source, including but not limited to, for example, combustion of materials such as oil, wood, or gas, waste heat from automotive, residential, or industrial exhaust, geothermal, solar, nuclear fission or fusion, or any combination of these. When the first surface, end or facet reaches a certain maximum temperature which causes a maximum electrical potential flowing in a first direction, the heat energy is removed from that first surface, end or facet and allowed to cool. The maximum temperature is inherent in the element, and is determined, at least in part, by the mass of the element, and the specific rate at which polycrystalline materials, particularly ZnO, conduct heat. The heat energy is then applied to the opposite second surface, end, or facet, which at that point in time is cooler than the first. While at the first surface, end or facet is being heated, the second surface, end or facet is being cooled. As the temperature of a first surface, end or facet rises, and its opposite cools, electrical potential is generated and flows in one direction of a circuit between the opposing surfaces, ends or facets of the ZnO element. When the opposite surface, end or facet is heated, and the first end of the element cools, the direction of the flow—the polarity—of electrical potential is reversed. The time period of each cycle should be sufficient to cause the voltage or current, or both, being produced by the heated ZnO element to slow or stop increasing, at which point the element should then be caused to cool, and the heat should be applied to the second surface.

A preferred embodiment of the present invention is comprised of at least one first ZnO element which is thermally isolated from at least one second ZnO element. Heat energy is alternately applied to the first ZnO and then to the second ZnO element. When the first ZnO element is being heated, the second is being cooled, and vice versa. If there are more than two ZnO elements, then heat energy is applied to each element sequentially, and at least a portion of the remaining elements cool down. Application of heat to a ZnO element produced according to the method described hereinabove causes an electrical potential to flow in one direction in a circuit in which the element is installed. As the element cools down, the electrical potential flows in the opposite direction.

In any of the embodiments described above, multiple units of the present invention can be caused to communicate with each other, being connected in electrical series or electrically parallel, causing the production of greater electrical potential or current or both.

In both pyroelectric applications and thermoelectric applications, a current producing device can be configured in virtually any manner. Referring to accompanying photographs and figures it can be seen the ease with which different configurations of ZnO Pyroelectric generating device can be created. The examples shown are by no means an exhaustive exhibit of possible configurations of the present invention.

FIGURES

Figure 1:
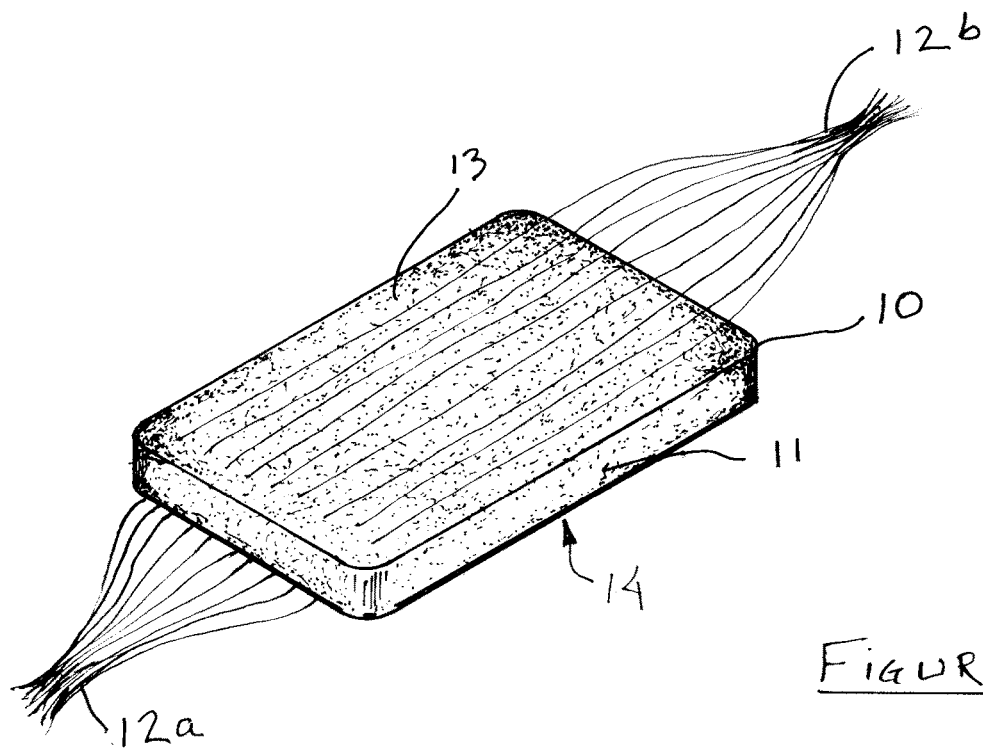
FIG. 1 is a perspective view of a component used in one embodiment of the subject system and method.

FIG. 1 shows a single electrical current producing assembly 10 of the present invention. Embedded into or affixed onto opposing surfaces 13 and 14 of consolidated polycrystalline element 11, which is comprised of polycrystalline pyroelectric or thermoelectric material, and preferably ZnO, are electrical conductors 12a and 12 b. The range of sizes of an element is essentially unlimited, but the practical constraints on scale are dependent upon the application, which includes the temperature of the medium conducting heat to and from the element. The conductors 12a and 12b, shown in this embodiment in a fibrous form, can be formed of metal shapes, wires, fibers, carbon fibers, carbon nanotubes and nanofibers, or conductive polymers provided they are resistant to the heat required to produce the elements and to produce the electrical voltage or current or both. Fine conductors, such as fine metal wires, carbon fibers, and carbon nanotubes and nanofibers are preferred in applications where the fine conductors can be spread approximately evenly across or into the opposing surfaces evenly. On the other hand, for electrical conductors of metal or other electrically conductive material capable of withstanding the heat of processing an element and the heat used to generate electrical current, voltage, or both, planar shapes (not shown) are preferred to applications in which the opposing surfaces 13 and 14 of the element 11 are entirely or almost entirely in contact with electrical conductors.

FIG. 2 shows another embodiment of a single electrical current producing assembly 20 of the present invention. The polycrystalline element 21 is comprised of polycrystalline pyroelectric or thermoelectric material, and is preferably ZnO. The range of sizes of an element of this embodiment is essentially unlimited, but the practical constraints on scale are dependent upon the application, which includes the temperature of the medium conducting heat to and from the element. In this embodiment, the electrical conductors 22a and 22b communicating with the polycrystalline element 21 are plates, bars, sheets or other shapes capable of comprised of electrically conductive materials including, but not limited to, metal, polymer and polymer composites, semiconductors, among others, that are resistant to the heat specific to an application. The dimensions of electrical conductors 22a and 22b depend on the size of the surfaces of pyroelectric element 21 that they are in contact with and the size of the surfaces of nonconductive shell 23 to which they are affixed. The thickness of electrical conductors 22a and 22b is dependent on the current, voltage, or both that is generated by the current producing assembly 20 when it is heated to produce electricity, and is also dependent on compliance with standard engineering practices for carrying such current, voltage, or both. An electrically nonconductive shell 23 comprised of a material capable of withstanding the heat of manufacture of the device as described hereinabove encapsulates the polycrystalline pyroelectric element 21, and locates the electrical conductors 22 by means of fasteners or adhesives or both, and causes the conductors to be in contact with the polycrystalline pyroelectric element 21. The polycrystalline pyroelectric element 21 fills the cavity formed between the shell 23 and conductors 22 so that the electrical conductors 22 are in contact with the polycrystalline pyroelectric element 21. The polycrystalline pyroelectric element 21 may be either consolidated as described hereinabove, or left in an unconsolidated powder form contained by the electrical conductors 22a and 22b in conjunction with the nonconductive shell 23.

Figure 3:
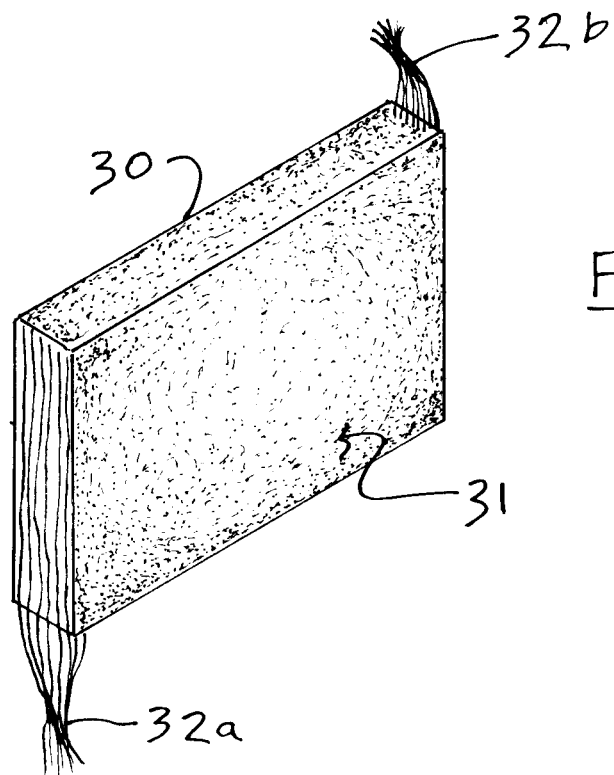
FIG. 3 is a perspective view of a component used in another embodiment of the subject system and method.

FIG. 3 shows an embodiment of a single electricity producing assembly 30. The polycrystalline element 31 is comprised of polycrystalline pyroelectric or thermoelectric material, and is preferably ZnO. The electrical conductors 32a and 32b are embedded into or affixed to ends of the polycrystalline element 31 that are separated by a greater possible dimension as compared to an assembly 10 of the embodiment shown in FIG. 1. The range of sizes for an assembly consistent with this embodiment is unlimited, but it is preferable that an assembly in which the dimension between the surfaces to which the electrical conductors 32a and 32b are affixed or embedded is greater by a factor of at least two (2) than either of the other dimensions.

FIG. 4 shows an embodiment of an electricity producing assembly 40 of the present invention that is analogous to that shown in FIG. 3 in that the electrical conductors 42a and 42b are affixed to ends of the polycrystalline element 41 that are separated by a greater possible dimension as compared to an assembly 10 of the embodiment shown in FIG. 1 or assembly 20 shown in FIG. 2. The polycrystalline element 41 is comprised of polycrystalline pyroelectric or thermoelectric material, and is preferably ZnO. The electrical conductors 42a and 42b, which are plates, bars, sheets or other shapes capable of comprised of electrically conductive materials including, but not limited to, metal, polymer and polymer composites, semiconductors, among others, that are resistant to the heat specific to an application, are affixed to the ends of the device, which contains the particulate polycrystalline element 41, which is encapsulated by the shell 43. The dimensions of electrical conductors 42a and 42b depend on the size of the surfaces of polycrystalline element 41 that they are in contact with and the size of the surfaces of nonconductive shell 43 to which they are affixed. The thickness of electrical conductors 42a and 42b is dependent on the current, voltage, or both that is generated by the current producing assembly 40 when it is heated to produce electricity, and is also dependent on compliance with standard engineering practices for carrying such current, voltage, or both. The electrically nonconductive shell 43, like that of the device shown in FIG. 2, is comprised of a material capable of withstanding the heat of manufacture of the device as described hereinabove encapsulates the polycrystalline element 41, and locates the electrical conductors 42a and 42b by means of fasteners or adhesives or both, and causes the conductors to be in contact with the ZnO 41. The polycrystalline element 41 fills the cavity formed between the shell 43 and conductors 42a and 42b so that the electrical conductors 42 are in contact with the polycrystalline pyroelectric element 41. The polycrystalline element 41 may be either consolidated as described hereinabove, or left in an unconsolidated powder form contained by the electrical conductors 42a and 42b in conjunction with the non-conductive shell 43.

FIG. 5 shows an embodiment of an electricity producing assembly 50 of the present invention in which a means to distribute heated fluid or gas through a mass of polycrystalline pyroelectric or thermoelectric material, preferably ZnO, that comprises the polycrystalline element 51, more advantageously, by providing, among other benefits, more effective transfer of heat from the heated gas or fluid to the polycrystalline element 51. The polycrystalline element 51 is encapsulated in a manner similar to that described for FIGS. 2 and 4, with electrical conductors 52a and 52b in contact and communication with opposing surfaces of polycrystalline element 51 and connected to each other and the electrically nonconductive and thermally conductive, heat resistant tubes 54 by electrically nonconductive and heat resistant shell 53. In the embodiment shown here, the electrical conductors 52a and 52b are similar except that they are mirrored versions of each other. Passing through the polycrystalline element 51 are a series of electrically nonconductive, thermally conductive, heat resistant tubes 54 through which pass the heated fluid or gas and which transfer the heat of the gas through the walls of the tubes 54 to the polycrystalline element 51. The range of sizes of an element of this embodiment is essentially unlimited, but the practical constraints on scale are dependent upon the application, which includes the temperature of the medium conducting heat to and from the element. This embodiment is suitable for industrial scale applications, in which large volumes of heated fluid, such as would be emitted by a fossil fuel burning electricity generating plant, would pass through an apparatus consistent with this embodiment. In this embodiment, the electrical conductors 52a and 52b communicating with the polycrystalline element 51 are plates, bars, sheets or other shapes capable of comprised of electrically conductive materials including, but not limited to, metal, polymer and polymer composites, semiconductors, among others, that are resistant to the heat specific to an application. The dimensions of electrical conductors 52a and 52b depend on the size of the surfaces of pyroelectric element 51 that they are in contact with and the size of the surfaces of nonconductive shell 53 to which they are affixed. The thickness of electrical conductors 52a and 52b is dependent on the current, voltage, or both that is generated by the current producing assembly 50 when it is heated to produce electricity, and is also dependent on compliance with standard engineering practices for carrying such current, voltage, or both. An electrically nonconductive shell 53 comprised of a material capable of withstanding the heat of manufacture of the device as described hereinabove, and the heat used to generate electricity according to this invention, encapsulates the polycrystalline pyroelectric element 51, and locates the electrical conductors 52 by means of fasteners or adhesives or both, and causes the conductors to be in contact with the polycrystalline pyroelectric element 51. The material of the shell may be from the group including ceramics, glass, metal coated with electrically nonconductive coatings on the sides of the tubes 54 in contact with the polycrystalline element 51, and high temperature polymers. The polycrystalline element 51 may be either consolidated as described hereinabove, or left in an unconsolidated powder form contained by the electrical conductors 52a and 52b in conjunction with the non-conductive shell 53.

Figure 6:
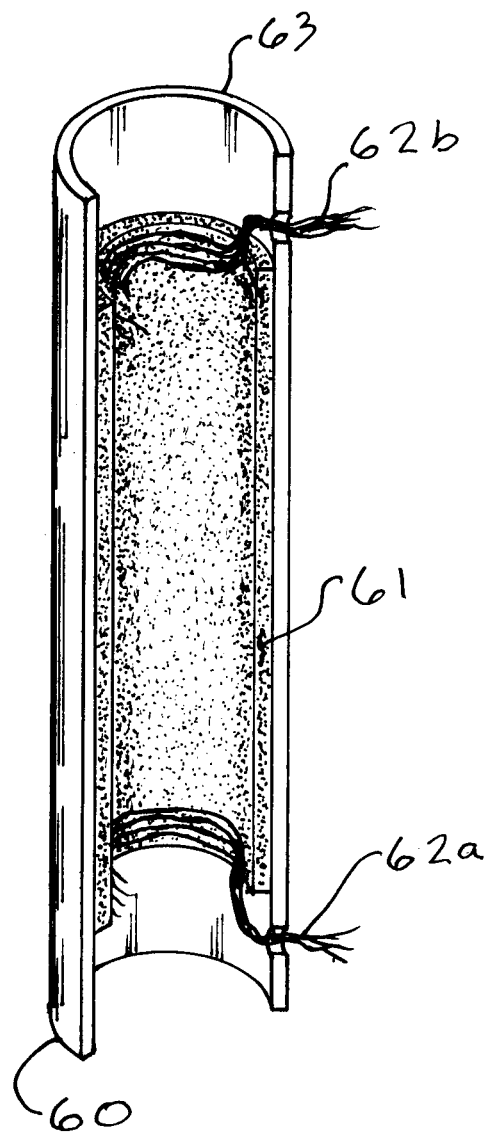

FIG. 6 shows an electricity generating assembly 60 of an embodiment of the present invention in which the mass of polycrystalline element 61 is distributed and adhered or otherwise affixed or attached along the inside of an electrically nonconductive, heat resistant conduit 63 comprised of materials from the group including, but not limited to, ceramics, glass, high temperature polymers, and metallic conduits internally coated with a nonconductive material that isolates the polycrystalline element 61 from contact with the metal of the conduit. The polycrystalline element 61 is comprised of polycrystalline pyroelectric or thermoelectric material, and is preferably ZnO. Electrical conductors 62a and 62b are affixed to or embedded into the ends of the mass of ZnO 61. The heated fluid or gas enters through one end of the device, passes through, and exits through the opposite end of the device. This embodiment is an advantageous application of the present invention in circumstances where large volumes of heated fluid pass through the apparatus and are used to generate electricity either by pyroelectric or thermoelectric means. The device of this embodiment is scaled so that it can process the quantity and temperature of gas required by the application.

Figure 7:
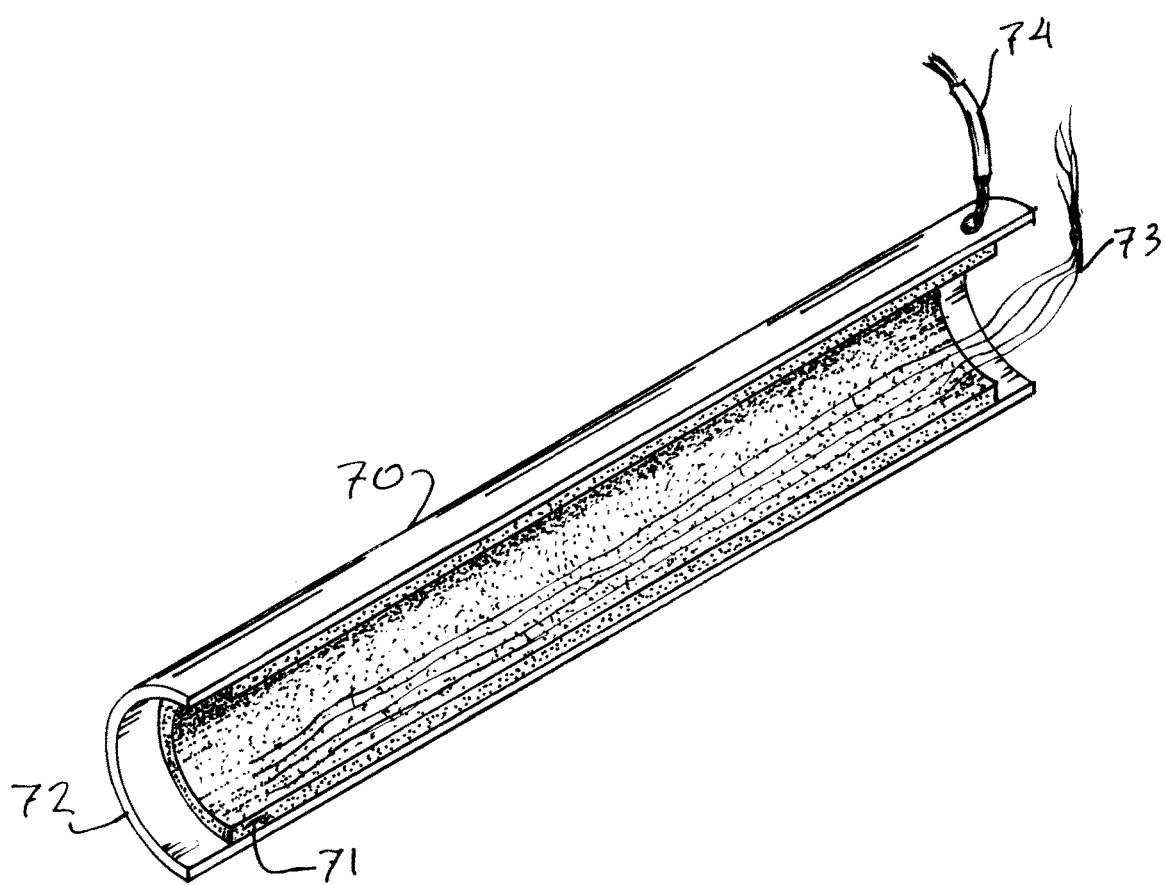

FIG. 7 shows an electricity generating assembly 70 of an embodiment of the present invention constructed similarly to that shown in FIG. 6. The polycrystalline element 71 is comprised of polycrystalline pyroelectric or thermoelectric material, and is preferably ZnO. However, in this embodiment, the conduit 72 is electrically conductive, and forms one of the electrical conductors in a circuit when the assembly is placed into the circuit. The electrical conductors 73 are embedded into or affixed to the polycrystalline element 71, providing the electrical conductor of the opposite charge to that provided by the conduit 72. A conventional conductor 74, such as a metallic wire, communicates between the assembly 70 via the conduit 72 with a circuit into which the device is installed.

Figure 8:
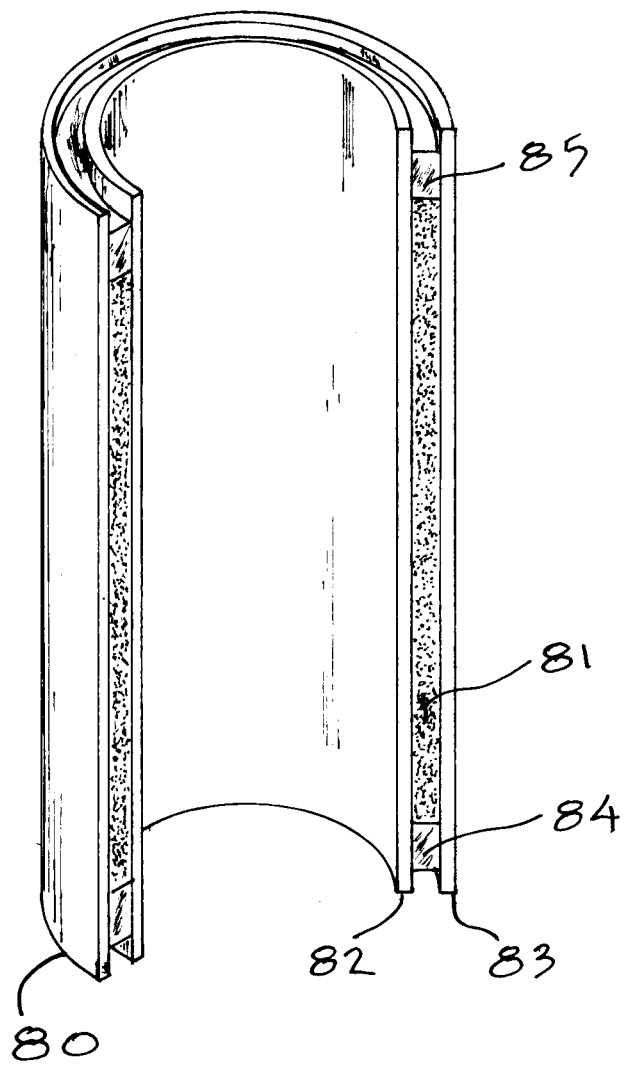

FIG. 8 shows an electricity generating assembly 80 of an embodiment of the present invention in which the specific material comprising each element changes the electrical measurements of the device. In this embodiment, the polycrystalline element 81 is comprised of a pyroelectric or thermoelectric material, and is preferably ZnO. The polycrystalline element 81, which can be either a consolidated structure or an unconsolidated mass of particulate ZnO, is encapsulated between an inner conduit 82, an outer conduit 83, a first endpiece 84, and a second endpiece 85.

In a first version of this embodiment, the two conduits, 82 and 83, are comprised of an electrically conductive and thermally conductive material capable of withstanding the heat of manufacture and application of the device, and the endpieces, 84 and 85, are comprised of an electrically nonconductive material also capable of withstanding the heat of manufacture and application of the device. In this version of the device, the conduits 82 and 83 provide the electrical conductors to carry the electrical current produced. Such conduit conductors are in a relatively close proximity to each other, and the distance between the conductors is relatively small, thus controlling the electrical production characteristics of the device according to the voltage and current equations shown hereinabove.

In a second version of this embodiment, the two conduits, 82 and 83, are comprised of an electrically nonconductive but thermally conductive material capable of withstanding the heat of manufacture and application of the device, and the endpieces, 84 and 85, are comprised of an electrically conductive material also capable of withstanding the heat of manufacture and application of the device. In this version of the device, the endpieces 84 and 85 provide the electrical conductors to carry the electrical current produced. Such endpiece conductors are in a relatively distant proximity to each other, and the distance between the conductors is relatively large, thus controlling the electrical production characteristics of the device, thus controlling the electrical production characteristics of the device according to the voltage and current equations shown hereinabove.

FIG. 9 shows an end view of an electrical generating assembly 90 of an embodiment of the present invention, wherein the polycrystalline elements 91 are assembled so that one portion of each element is inside electrically nonconductive conduit 94, and the remainder of each element is outside conduit 94. FIG. 9a shows a cut-away perspective of the same embodiment shown in FIG. 9. In this embodiment, the polycrystalline elements 91 are comprised of a pyroelectric or thermoelectric material, which is preferably ZnO. The polycrystalline elements 91 may also be encapsulated as described above in FIGS. 2 and 4, with the electrically conductive conductors described in those figures substituted for the inner electrically conductive filaments 92 and outer electrically conductive filaments 93 shown in FIG. 9. In FIGS. 9 and 9a, the inner electrically conductive filaments 92, and the outer conductive elements 93 are shown connected in parallel. In an alternate version of this embodiment, which is not shown, the conductors would be connected in series. In practice, hot fluid (not shown) is conducted through the conduit, and impinges on the portions of the polycrystalline elements 91 that are inside the conduit 94 causing those portions of the polycrystalline elements to become heated. The portions of the polycrystalline elements 91 on the outside of the conduit 94 would be cooled by the ambient environment, thus a temperature differential would be created between the portion within the conduit 94 and outside the conduit 94, thereby generating an electrical current, voltage, or both.

Figure 10A:
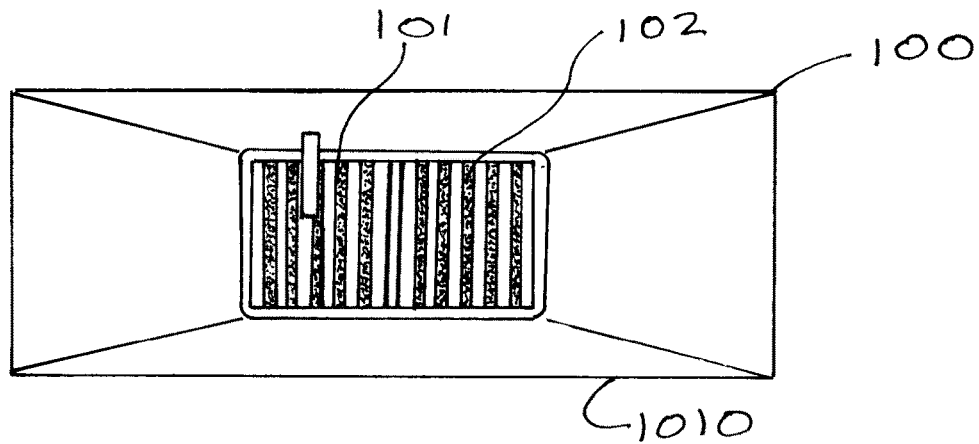
FIG. 10a is top plan view of a component part used in an embodiment of the subject system and method.
Figure 10:
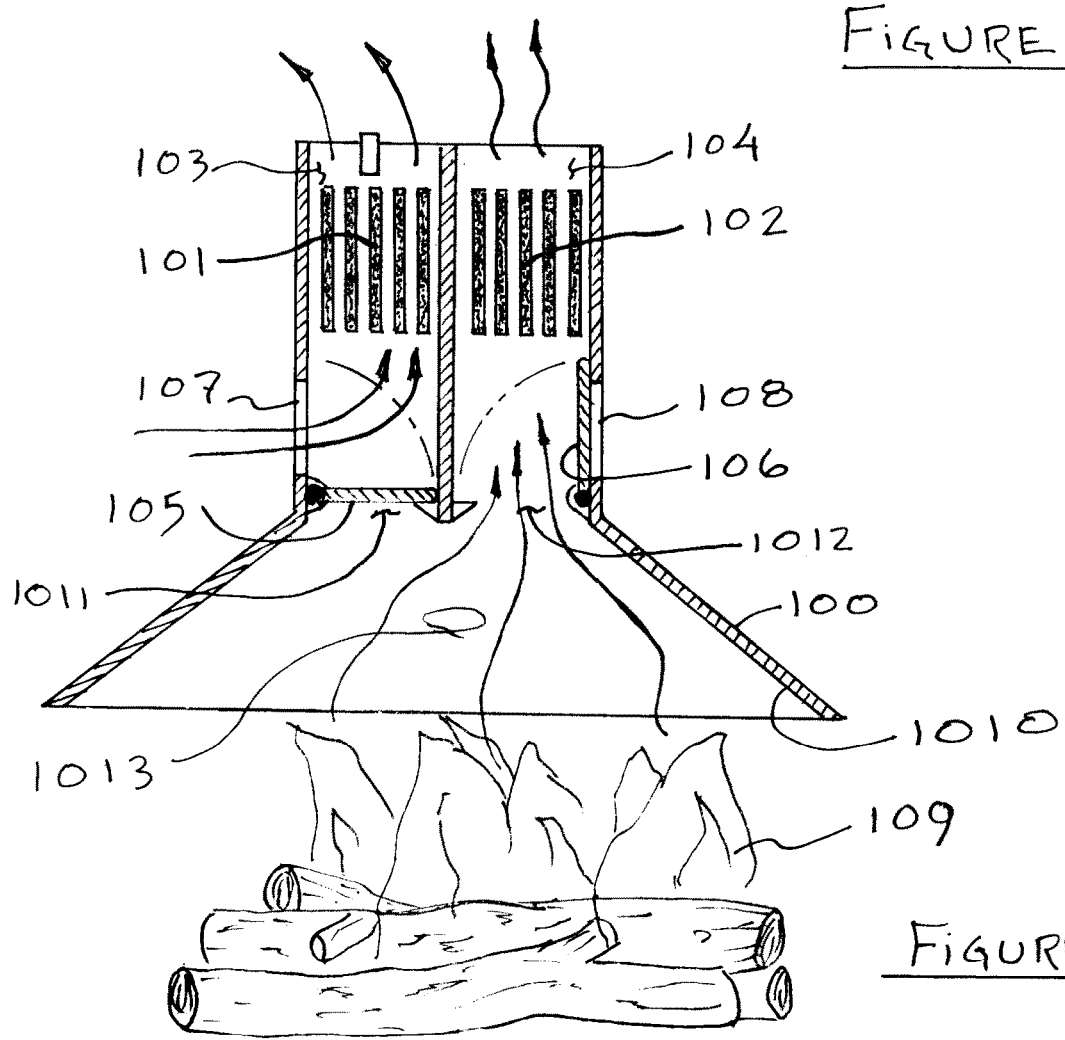
FIG. 10 is a side elevation cross section detailing the subject system.

FIG. 10 shows an embodiment of the present invention that demonstrates a manner in which the present invention can be implemented, utilizing the alternate heating and cooling of the ZnO elements of the present invention to make advantageous use of the pyroelectric principles of the present invention. In FIG. 10 the electrical current producing assembly 100 of the present invention utilizes the pyroelectric effect to produce electrical current from a low quality heat source 109. The heat conducting structure 1010 is fabricated from a heat resistant material capable of providing the structure and support for the assembly and its components, from a group including but not limited to, for instance, iron, steel, copper, brass, bronze or other readily available materials including recycled and repurposed versions of the materials from the group. The structure 1010 forms at least two conduits 103 and 104 through which the hot gas 1013 from heat source 109 passes and which guides the hot gas 1013 to the polycrystalline pyroelectric elements 101 and 102. Within the heat conducting structure 1010 at least one of each of the polycrystalline pyroelectric elements 101 and 102, are mounted in at least two separate conduits, 103 and 104. Hot gas 1013 from heat source 109 is alternately guided from the heat source 109 over one pyroelectric element 101, and the other pyroelectric element 102. While hot gas is guided to and passing over one of the elements 101 and 102, cool air is guided to the other of the pyroelectric elements 101 and 102. Hot gas 1013 is released from or generated by a heat source 109 such as a wood fire. Two valves, 105 and 106, shown as flaps, are shown in the figure of the embodiment with valve 105 being closed to the hot gas 109 while opening port 107 and valve 106 is open to the hot gas 1013 and has closed port 108. Situated in the side of the conduits 103 and 104 are ports 107 and 108, which respectively cause conduits 103 and 104 to communicate with ambient air which is passed over polycrystalline pyroelectric elements 101 and 102 respectively. The valves 105 and 106 alternately open to the heat source to cause hot gas to pass over one set of the polycrystalline pyroelectric elements 101 and 102 and simultaneously close ports 107 and 108 to the cooling air. For instance, when polycrystalline pyroelectric element 101 in conduit 103 reaches a certain maximum temperature, valve 105 closes hot gas port 1011 in conduit 103 to the heat source and opens port 108 in conduit 103 to the air, allowing cool air to pass over element 101. Meanwhile, a linkage (not shown) between valve 105 and valve 106 causes valve 106 to open the hot gas port 1012 to the heat source while closing port 110 in conduit 104 thus stopping cool air from entering into conduit 104, allowing hot air to pass over element 102. At such time as element 102 reaches its maximum temperature, the same sequence of events as described for when element 101 reached its maximum temperature occurs for element 102. The cycles alternate repeatedly, causing the elements 101 and 102 to heat and cool alternately. The alternating heating and cooling of opposing polycrystalline pyroelectric elements 101 and 102 generates electrical current, voltage, or both, through the pyroelectric process.

Figure 11:
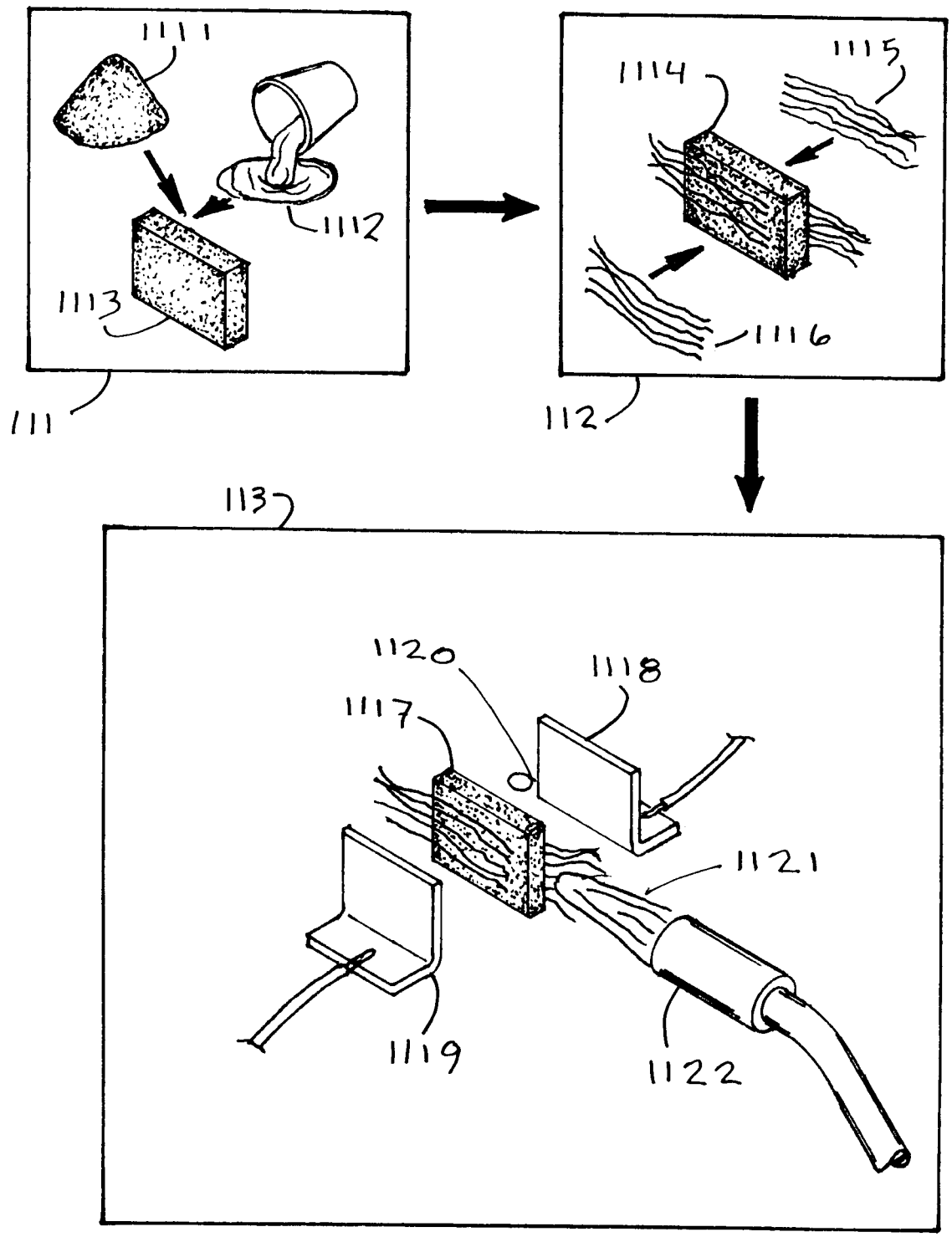
FIG. 11 is a process flow diagram of a method for producing an embodiment of the subject system.

FIG. 11 shows a process flow diagram for an embodiment of the present invention for the production of the apparatus of the invention necessary for the generation of electricity according to the invention. In step 111, which is the first step in the process, polycrystalline pyroelectric or thermoelectric material 1111 is combined with a binding material 1112 such as linseed oil or safflower oil to form a cohesive mass of a polycrystalline element 1113. In step 112, the second step of the process, electrical conductors 1115 and 1116, shown as fibers in the figure, are affixed or embedded to the polycrystalline element 1113 from step 111 to form the polycrystalline element with conductors 1114. In step 113, the third step, the polycrystalline element with conductors 1114 from step 112 is placed between electrodes 1118 and 1119 which emit an electrical field 1120, and simultaneously heat 1121 from heat source 1122 is applied until the cohesive mass 1114 becomes the consolidated polycrystalline element 1117.

Figure 12:
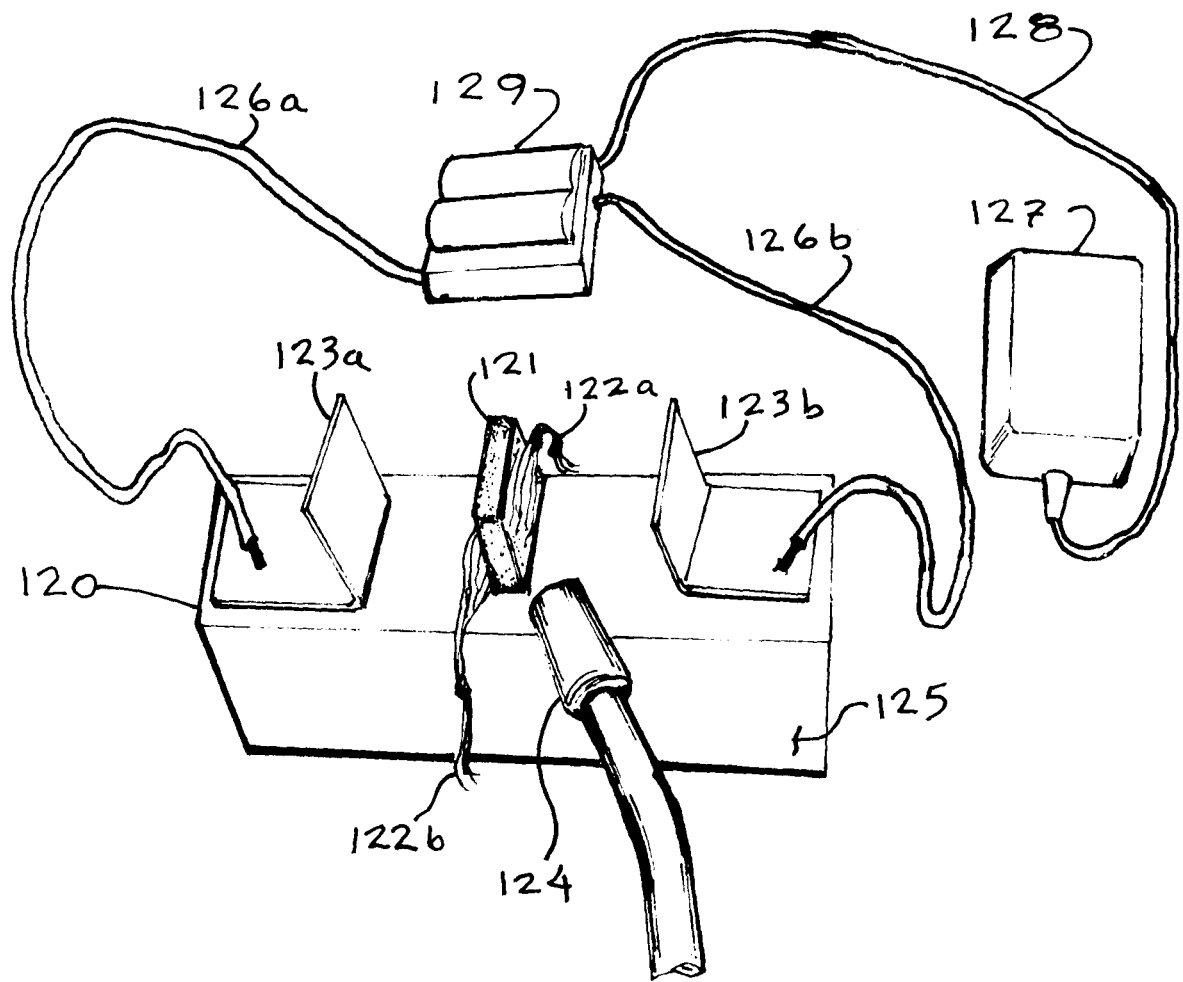
FIG. 12 is a perspective view detailing an embodiment of the subject system and method during the development of the invention.

FIG. 12 shows an embodiment of the present invention that demonstrates the manner in which the present invention can be implemented to produce and test a polycrystalline element 121, utilizing the method incorporating immersing the polycrystalline element 121 into an electrical field while simultaneously heating the polycrystalline element 121, to make advantageous use of the pyroelectric principles of the present invention.

The components of the embodiment of the electricity generating assembly 120 of the present invention include the polycrystalline element 121, comprised of a pyroelectric or thermoelectric material such as zinc oxide, the electrical conductors 122a and 122b which in this embodiment are comprised of carbon fibers, electrodes 123a and 123b which emit the electric field (not shown) into which the polycrystalline element 121 is immersed when it is placed approximately equidistant between electrodes 123a and 123b. In this embodiment, electrical conductors 122a and 122b are shown as disconnected from any circuit and hanging from polycrystalline element 121. Heat source 124 is in this embodiment a propane burner directed in such a manner as to cause its flame and hot gases to impinge on polycrystalline element 121 and cause its temperature to rise. Polycrystalline element 121, with its affixed electrical conductors 122a and 122b are temporarily affixed to block 125 which in this embodiment is a heat resistant, ceramic block, to which electrodes 123a and 123b are firmly affixed. Electrodes 123a and 123b electrically communicate with transformer 129, which in this embodiment is a flyback-type transformer, via electrically conductive wires 126a and 126b. Transformer 129 converts the low voltage from power supply 127 to the high voltage of about 10 kilovolts necessary to supply the electric field between electrodes 123a and 123b.

The embodiments of the present invention shown in the foregoing figures are exemplars of embodiments of the invention that could be used, for example, as a means to harvest wasted heat energy from a cooking fire of the type often employed in developing areas of the world to produce electrical current for charging the batteries of electrical appliances including but not limited to, for example, portable computers distributed to children in such countries.

EXAMPLES

Examples provided in this description show examples of the method by which embodiments of the present invention are produced, examples of finished ZnO structures, and examples of the utilization of said finished ZnO structures to produce electrical potential, current or both.

Example 1

The setup of equipment for production of an embodiment of the device of the present invention is shown in FIG. 12, above. In the example, the apparatus was comprised of a power supply (power supply 127) and electrical current transformer (transformer 129) electrically communicating with two electrodes (electrodes 123a and 123b) situated approximately five (5) centimeters apart on a heat resistant surface of a refractory brick block (block 125). An electrical field was emitted from the electrodes which caused the electrical charges of the crystals to be uniformly oriented.

The polycrystalline element (polycrystalline element 121) was comprised of a quantity of particulate ZnO combined with a quantity of an oil, in the case of this example, either safflower or linseed oil or a combination of both. Said quantity of oil was sufficient such that when mixed with said particulate ZnO, the ZnO-oil combination acquired a consistency and body ranging from oil paint-like to clay-like prior to heating. The ZnO-oil combination was formed into the desired shape. In the case of the example herein described, the shape was that of a rectangular lozenge measuring approximately 2.5 cm×2.5 cm×0.5 cm. Carbon fiber filaments were embedded into both opposing 2.5 cm×2.5 cm facets of the lozenge, and in this example, were affixed in place with a thin layer of furnace cement. Said filaments were distributed evenly or approximately evenly across each of the facets.

The polycrystalline element which comprised the workpiece was installed equidistantly between the electrodes.

The electrical conductors (electrical conductors 122a and 122b), which were affixed or embedded to the polycrystalline element and were comprised of carbon fiber, were left hanging. Heat from the heat source (heat source 124), which was a propane torch, was applied to the workpiece element until it formed a consolidated mass capable of being handled when it cooled. The assembly was then first heated to a lower temperature in the range of 100° C. (212° F.) to 260° C. (500° F.). Next, the element was further heated to a higher temperature in the range of 149° C. (300° F.) and 1995° C. (3623° F.) while an electrical field was created between the two opposing electrodes which surrounded the element. Heat was applied until the oil that was mixed with said ZnO evaporated or combusted or both, and the polycrystalline element had attained a sintered or sintered-like state. The resulting finished electricity generating assembly contained no or approximately no carbon. The finished ZnO lozenge is then permitted to cool.

When completed, the electricity generating assembly was able to maintain its shape and was able to be handled and installed into an electrical circuit and an apparatus suitable for taking advantages of the benefits of the present invention for generating electrical current, voltage, or both. In this example, the electricity generating elements produced had electrical conductors affixed or embedded on the opposing broad surfaces of the elements, causing the elements to exhibit electrical characteristics modeled by the equations above. The opposing surfaces were 2.5 cm×2.5 cm and the distance between those surfaces was 0.5 cm. Those electrical characteristics tended to be more suitable for embodiments of the invention that utilized the periodic heating and cooling steps of the electricity generating method described herein to generate an alternating current. FIG. 1 shows an example of the finished, consolidated polycrystalline element with the electrically conductive filaments affixed to it.

Example 2

The setup of the apparatus of a second embodiment of the invention to produce electricity generating elements was identical to that of Example 1, as was the method of causing the electrical charges of the elements to become uniformly oriented and the application of heat to cause the element to be consolidated. The polycrystalline element was formed identically as well, with the exception that the only difference in this example is that the electrical conductors affixed to or embedded into the polycrystalline element were situated on the opposing narrow ends of the element, thereby putting a distance between the electrical conductors that was of a greater dimension relative to the dimensions of the opposing surfaces to which the electrical conductors were embedded or affixed, which is to say that in this example the opposing surfaces of the polycrystalline element were roughly 2.5 cm×0.5 cm and the distance between those surfaces was 2.5 cm. This is different from the example described in Example 1, where the opposing surfaces were 2.5 cm×2.5 cm and the distance between those surfaces was 0.5 cm. The electricity generating elements in this example tended to be more suitable for taking advantage of the embodiments of the method for generating electricity according to the invention that utilized the heating of one end of an element while cooling the opposing end of the element so as to create a temperature differential to produce electrical current, voltage, or both. FIG. 3 shows an example of the finished, consolidated electricity generating element with the electrically conductive filaments affixed to it.

Example 3

This example shows the application of the present invention to generating electricity. The setup of the apparatus in this example consisted of placing a finished consolidated polycrystalline element onto a heatproof surface similar to the block in Examples 1 and 2. The carbon fiber electrodes of the polycrystalline element were connected to an electrical multimeter, with one carbon fiber electrode connected and communicating with the negative port of the multimeter and the other, opposing, electrode connected with the positive port of the multimeter. Heat was applied from a propane torch to the polycrystalline element. The temperature of the heat from the propane torch was approximately 1995° C. (3623° F.). Sequential measurements were taken of the voltage output of the polycrystalline element as it was heated. The first measurement after heating the polycrystalline element occurred after approximately within approximately 10 seconds of applying heat from the torch, and the resulting electrical measurement was 104 millivolts. The second measurement was taken approximately 5 seconds—15 seconds after heat was first applied—with a resulting electrical measurement of 109 millivolts. The third and final measurement was taken 5 more seconds later—20 seconds after the heat was first applied—with a resulting electrical measurement of 111 millivolts.

Example 4

This example shows the application of the present invention to generating electricity. The setup of the apparatus in this example consisted of placing a finished consolidated polycrystalline element onto a heatproof surface similar to the block in Examples 1 and 2. The carbon fiber electrodes of the polycrystalline element were connected to an electrical multimeter, with one carbon fiber electrode connected and communicating with the negative port of the multimeter and the other, opposing, electrode connected with the positive port of the multimeter. Heat was applied from a propane torch to the polycrystalline element. The temperature of the heat from the propane torch was approximately 1995° C. (3623° F.). Sequential measurements were taken of the electrical current output of the polycrystalline element as it was heated. The first measurement after heating the polycrystalline element occurred after approximately within approximately 10 seconds of applying heat from the torch, and the resulting electrical measurement was 887 microamperes. The second measurement was taken approximately 5 seconds—15 seconds after heat was first applied—with a resulting electrical measurement of 914 microamperes. The third and final measurement was taken 5 more seconds later—20 seconds after the heat was first applied—with a resulting electrical measurement of 929 microamperes.

Example 5

An example of a further embodiment of the enabled device of the present invention is modeled in FIG. 9, with the exception that in this example the multiple polycrystalline elements are connected in series, rather than in parallel as shown in FIG. 9. The example was comprised of a series of finished polycrystalline elements produced according to the description of the method set forth above, with the exception that the electrically conductive filaments were affixed to opposite narrow ends of the polycrystalline elements instead of the opposite broad facets. An example of the finished consolidated polycrystalline elements used in this example are seen in FIG. 3. It is further comprised of a heat resistant, electrically non-conductive conduit into which multiple, evenly spaced slots were formed around the diameter of the end of said conduit. Said slots were formed to match the dimensions of the thickness and the height of the broad facets of the polycrystalline elements. The slots were oriented so that the long dimension of the slots was parallel to the axis of said conduit. The polycrystalline elements were inserted into said slots so that approximately half of each polycrystalline element was inside the diameter of said conduit, and the remainder is outside said conduit. In the example, the polycrystalline elements were affixed to the conduit with furnace cement, which was then heated to its solidification point which caused the polycrystalline elements to be held in place in said conduit. It can be seen in FIGS. 9 and 9a that the polycrystalline elements are positioned in such a manner that spaces or passages between each polycrystalline element were formed.

In the shown example, eleven individual polycrystalline elements were electrically connected in series, with the cluster of filaments affixed to the outside end of the first polycrystalline element left unconnected so as to communicate with an electrical current measuring device or experimental circuit, and the cluster of filaments affixed the inside end of the eleventh polycrystalline element was left unconnected so as to communicate with the opposite pole of said electrical current measuring device or experimental circuit. The cluster of filaments affixed to the inside end of a first polycrystalline element was connected to the cluster of filaments affixed to the outside end of a second polycrystalline element. The cluster of filaments affixed to the inside end of said second polycrystalline element was connected to the cluster of filaments affixed to the outside end of a third lozenge, and so on until the eleventh polycrystalline element where the cluster of filaments affixed to the inside end of said eleventh polycrystalline element was left unconnected as described above.

To produce electrical potential and current with the example, heated gas from a propane torch was passed through the inside of the conduit, passing between and over the ends of the polycrystalline elements that were inside the conduit. Meanwhile, cooler gas, specifically, ambient air, passed over the ends of the polycrystalline elements that were outside the conduit. Measurements of electrical current and potential were taken across the cluster of filaments affixed to the outside end of said first polycrystalline element and the cluster of filaments affixed to the inside end of said eleventh polycrystalline element. To insert the device into a circuit, said two clusters of filaments were used to communicate with said circuit.

By using the method and device of the present invention, heat energy, including waste heat, can be used to produce higher value energy forms, including electricity, as shown in the present example, by using an inexpensive, relatively nontoxic and non-hazardous, and plentiful material. The method and device may be defined to include the following:

A1. An apparatus system for generating electrical potential or current or both comprised of:
(i) a quantity of polycrystalline pyroelectric material formed into a cohesive mass capable of retaining its volume and shape by means of compression, heat, containment or any combination of the three, said cohesive mass having at least two electrically conductive elements comprised of materials selected from the group including, but not limited to, metallic or carbon conductors, wires, fibers, nanotubes, or nanofibers, singly or in any combination, affixed to or embedded into opposing regions, surfaces, or facets, of the cohesive mass; and
(ii) an electrical circuit connected to Installation of said mass of polycrystalline pyroelectric material and effective for conducting or conveying electrical potential or electrical current from one side or facet of said mass of polycrystalline pyroelectric material to the opposite side of said mass through said electrical circuit.

A2. An apparatus for generating electrical potential or current as in A1, wherein said cohesive mass of polycrystalline pyroelectric material and the crystals therein have a uniform electrical polarity.

A3. An apparatus for generating electrical potential or current as in A1, wherein said quantity of polycrystalline pyroelectric material is polycrystalline zinc oxide.

A4. An apparatus for generating electrical potential or current as in A2, wherein said quantity of polycrystalline pyroelectric material is polycrystalline zinc oxide.

A5. An apparatus for generating electrical potential or current as in A3 further comprising:
(i) a heater selected from the group including, but not limited to, a combustion heat source, a solar heat source, a geothermal heat source, a nuclear fission heat source, a nuclear fusion heat source, or a waste heat source, singly or in any combination, with the heat from said heater being conducted to said cohesive mass of polycrystalline pyroelectric material by a medium heated by the heater including, but not limited to gaseous or liquid fluid heated by said source or sources, gaseous or liquid exhaust fluid from said source or sources, or by direct contact with said source or sources; singly or in any combination, said heated medium to be conducted, transferred or conveyed into contact with said cohesive mass by at least one of the group including, but not limited to, a duct, vent, tube, valve, plenum, conduit, pipe or other means of causing said cohesive mass to contact said heated medium, singly or in any combination; and
(ii) a cooler selected from the group including, but not limited to an ambient air conductor, refrigerated gaseous or liquid fluid cooler, an electronic cooler, or solid state cooler, singly or in combination, with cooling from said cooling source conducted to said cohesive mass of polycrystalline pyroelectric material by a cooled medium selected from a group including, but not limited to air, gaseous or liquid fluid, or by direct contact with said cooling source, singly or in any combination; and said cooled medium to be conducted, transferred or conveyed into contact with said cohesive mass, by at least one of the group including, but not limited to, a duct, vent, tube, valve, plenum, conduit, pipe or other means of causing said cohesive mass to contact said heated medium, singly or in any combination.

A6. An apparatus for generating electrical potential or current as in A4 further comprising:
(i) a heater selected from the group including, but not limited to a combustion heat source, a solar heat source, a geothermal heat source, a nuclear fission heat source, a nuclear fusion heat source, or a waste heat source, singly or in any combination, with the heat from said heater being conducted to said cohesive mass of polycrystalline pyroelectric material by a medium heated by the heater including, but not limited to gaseous or liquid fluid heated by said source or sources, gaseous or liquid exhaust fluid from said source or sources, or by direct contact with said source or sources; singly or in any combination, said heated medium to be conducted, transferred or conveyed into contact with said cohesive mass by at least one of the group including, but not limited to, a duct, vent, tube, valve, plenum, conduit, pipe or other means of causing said cohesive mass to contact said heated medium, singly or in any combination; and (ii) a cooler selected from the group including, but not limited to an ambient air conductor, refrigerated gaseous or liquid fluid cooler, an electronic cooler, or solid state cooler, singly or in combination, with cooling from said cooling source conducted to said cohesive mass of polycrystalline pyroelectric material by a cooled medium selected from a group including, but not limited to air, gaseous or liquid fluid, or by direct contact with said cooling source, singly or in any combination; and said cooled medium to be conducted, transferred or conveyed into contact with said cohesive mass, by at least one of the group including, but not limited to, a duct, vent, tube, valve, plenum, conduit, pipe or other means of causing said cohesive mass to contact said heated medium, singly or in any combination.

A7. An apparatus for generating electrical potential or current as in A3 wherein said cohesive mass incorporates a binding material distributed throughout the entirety of the cohesive mass of polycrystalline material in a manner that causes approximately all the crystals of the polycrystalline mass to remain in intimate physical contact and electrically communicative throughout the entire volume of said cohesive mass of polycrystalline pyroelectric material, and which is comprised of materials selected from the group including, but not limited to, safflower oil, linseed oil, vegetable oil, emulsions of water and oil, water, and water mixed with additives, or solvent based materials, including but not limited to, rubber, hide based adhesive material, or any combination thereof, and which said binding material is compressed and heated until the polymer is cured or polymerized, and said mass of polycrystalline pyroelectric material is consolidated sufficiently to permit handling or other processing.

A8. An apparatus for generating electrical potential or current as in A3 wherein said pyroelectric material is a cohesive mass of said polycrystalline pyroelectric material which fills a three dimensional volume that is comprised of:
(i) at least two spatially separate, and preferably opposing, electrically conductive elements;
(ii) at least one hollow, electrically non-conductive element capable of electrically and mechanically separating said at least two opposing electrically conductive elements, said at least one non-conductive element being capable of containing a hollow three dimensional void;
(iii) an enclosed three dimensional void formed within the assembly of said at least two opposing electrically conductive elements to said separated, and preferably opposing, ends of said at least on non-conductive element;
(iv) a quantity of said polycrystalline pyroelectric material sufficient to completely or approximately fill said three dimensional void in such a manner as to cause said pyroelectric material to be in intimate contact with the interior surfaces of said electrically conductive elements; and (v) parts joining devices or materials selected from the group included but not limited to adhesives, screws, or welding sufficient to seal said pyroelectric material into said void in such a manner that said pyroelectric material does not leak or escape from said void.

A9. An apparatus for generating electrical potential or current as in A3 wherein said cohesive mass of polycrystalline pyroelectric material is affixed to a substrate comprised of an electrically conductive, heat resistant material, selected from the group including but not limited to, metal such as aluminum, copper, iron, steel, platinum, titanium, or semiconductor material such as, for instance, silicon oxide or gallium arsenide, singly or in any combination, or an electrically non-conductive or semiconductive, heat resistant material, selected from the group including but not limited to, ceramic, glass, cementitious materials, or polymeric material, including but not limited to, silicone polymers, singly or in any combination.

A10. An apparatus for generating electrical potential or current as in A4 wherein said cohesive mass incorporates a binding material distributed throughout the entirety of the cohesive mass in a manner that causes approximately all the crystals of the polycrystalline mass to remain in intimate physical contact and electrically communicative throughout the entire volume of said cohesive mass of polycrystalline pyroelectric material, comprised of materials from selected the group comprised of safflower oil, linseed oil, vegetable oil, emulsions of water and oil, water, and water mixed with additives, or solvent based materials, including but not limited to, rubber, hide based adhesive material, or any combination thereof, in the mass of polycrystalline material distributed throughout the mass of said polycrystalline material in a manner that causes the crystals of the polycrystalline mass to remain electrically communicative throughout the entire volume of said cohesive mass of polycrystalline pyroelectric material, and said binding material is compressed and heated until the polymer is cured or said mass of polycrystalline pyroelectric material is consolidated sufficiently to permit handling or other processing.

A11. An apparatus for generating electrical potential or current as in A4 wherein said means of forming said pyroelectric material into a cohesive mass is causing said polycrystalline pyroelectric material to fill a three dimensional volume that is comprised of:
(i) At least two spatially separate, and preferably opposing, electrically conductive elements;
(ii) At least one hollow, electrically non-conductive element capable of electrically and mechanically separating said at least two opposing electrically conductive elements, said at least one non-conductive element being capable of containing a hollow three dimensional void;
(iii) an enclosed three dimensional void formed within the assembly of said at least two opposing electrically conductive elements to said separated, and preferably opposing, ends of said at least on non-conductive element;
(iv) a quantity of said polycrystalline pyroelectric material sufficient to completely or approximately fill said three dimensional void in such a manner as to cause said pyroelectric material to be in intimate contact with the interior surfaces of said electrically conductive elements; and
(v) parts joining devices or materials selected from the group included but not limited to adhesives, screws, or welding sufficient to seal said pyroelectric material into said void in such a manner that said pyroelectric material does not leak or escape from said void.

A12. An apparatus for generating electrical potential or current as in A4 wherein said cohesive mass of polycrystalline pyroelectric material is affixed to a substrate comprised of an electrically conductive, heat resistant material, selected from the group including but not limited to, metal such as aluminum, copper, iron, steel, platinum, titanium, or semiconductor material such as, for instance, silicon oxide or gallium arsenide, singly or in any combination, a substrate of an electrically non-conductive or semiconductive heat resistant material from the group including ceramic, glass, cementitious materials, or polymeric material, including but not limited to, silicone polymers, singly or in any combination.

A13. An apparatus for generating electrical potential or current or both comprised of:
(i) a quantity of polycrystalline thermoelectric material formed into a cohesive mass capable of retaining its volume and shape by means of compression, heat, containment or any combination of the three, said cohesive mass having at least two electrically conductive elements comprised of materials from the group including, but not limited to, metallic or carbon conductors, wires, fibers, nanotubes, or nanofibers, singly or in any combination, affixed to or embedded into opposing regions, surfaces, or facets, of the cohesive mass; and
(ii) installation said mass of polycrystalline thermoelectric material in an electrical circuit and conducting or conveying electrical potential or electrical current from one side or facet of said mass of polycrystalline thermoelectric material to the opposite side of said mass through said electrical circuit.

A14. An apparatus for generating electrical potential or current as in A13, wherein said cohesive mass of polycrystalline thermoelectric material and the crystals therein have a uniform electrical polarity.

A15. An apparatus for generating electrical potential or current as in A13, wherein said quantity of polycrystalline thermoelectric material is polycrystalline zinc oxide.

A16. An apparatus for generating electrical potential or current as in A14, wherein said quantity of polycrystalline thermoelectric material is polycrystalline zinc oxide.

A17. An apparatus for generating electrical potential or current as in A15 which is also comprised of:
(i) a heater selected from the group including, but not limited to, a combustion heat source, a solar heat source, a geothermal heat source, a nuclear fission heat source, a nuclear fusion heat source, or a waste heat source, singly or in any combination, with the heat from said heater being conducted to a first region, surface or facet said cohesive mass of polycrystalline thermoelectric material by a heated medium including, but not limited to gaseous or liquid fluid heated by said source or sources, gaseous or liquid exhaust fluid from said source or sources, or by direct contact with said source or sources; singly or in any combination, said heated medium to be conducted, transferred or conveyed into contact with said cohesive mass by at least one selected from the group including, but not limited to, a duct, vent, tube, valve, plenum, conduit, pipe or other means of causing said cohesive mass to contact said heated medium, singly or in any combination; and
(ii) a cooler selected from the group including, but not limited to, ambient air conductor, refrigerated gaseous or liquid fluid cooler, an electronic cooler, or solid state cooler, singly or in combination, with cooling from said cooling source conducted to a second region, surface, or facet of said cohesive mass of polycrystalline thermoelectric material spatially opposed to said first region, surface, or facet of said cohesive mass, by a medium cooled by the cooler selected from a group including, but not limited to air, gaseous or liquid fluid, or by direct contact with said cooling source, singly or in any combination; and said cooled medium to be conducted, transferred or conveyed into contact with said cohesive mass, by at least one selected from the group including, but not limited to, a duct, vent, tube, valve, plenum, conduit, pipe or other means of causing said cohesive mass to contact said heated medium, singly or in any combination.

A18. An apparatus for generating electrical potential or current as in A16 which is also comprised of:
(i) a heater selected from the group including, but not limited to, a combustion heat source, a solar heat source, a geothermal heat source, a nuclear fission heat source, a nuclear fusion heat source, or a waste heat source, singly or in any combination, with the heat from said heater being conducted to said cohesive mass of polycrystalline thermoelectric material by a heated medium including, but not limited to gaseous or liquid fluid heated by said source or sources, gaseous or liquid exhaust fluid from said source or sources, or by direct contact with said source or sources; singly or in any combination, said heated medium to be conducted, transferred or conveyed into contact with said cohesive mass by at least one selected from the group including, but not limited to, a duct, vent, tube, valve, plenum, conduit, pipe or other means of causing said cohesive mass to contact said heated medium, singly or in any combination;
(ii) a cooler selected from the group including, but not limited to, ambient air conductor, refrigerated gaseous or liquid fluid cooler, an electronic cooler, or solid state cooler, singly or in combination, with cooling from said cooling source conducted to said cohesive mass of polycrystalline thermoelectric material by a medium cooled by the cooler selected from a group including, but not limited to air, gaseous or liquid fluid, or by direct contact with said cooling source, singly or in any combination; and said cooled medium to be conducted, transferred or conveyed into contact with said cohesive mass, by at least one selected from the group including, but not limited to, a duct, vent, tube, valve, plenum, conduit, pipe or other means of causing said cohesive mass to contact said heated medium, singly or in any combination.

A19. An apparatus for generating electrical potential or current as in A15 wherein said cohesive mass incorporates a binding material distributed throughout the entirety of the cohesive mass of polycrystalline material in a manner that causes approximately all the crystals of the polycrystalline mass to remain in intimate physical contact and electrically communicative throughout the entire volume of said cohesive mass of polycrystalline pyroelectric material, comprised of materials from the group including, but not limited to, safflower oil, linseed oil, vegetable oil, emulsions of water and oil, water, and water mixed with additives, or solvent based materials, including but not limited to, rubber, hide based adhesive material, or any combination thereof, said binding material is compressed and heated until the polymer is cured or polymerized, and said mass of polycrystalline pyroelectric material is consolidated sufficiently to permit handling or other processing.

A20. An apparatus for generating electrical potential or current as in A15 wherein said means of forming said thermoelectric material into a cohesive mass is causing said polycrystalline thermoelectric material to fill a three dimensional volume that is comprised of:
(i) at least two spatially separate, and preferably opposing, electrically conductive elements;
(ii) at least one hollow, electrically non-conductive element capable of electrically and mechanically separating said at least two opposing electrically conductive elements, said at least one non-conductive element being capable of containing a hollow three dimensional void;
(iii) an enclosed three dimensional void formed within the assembly of said at least two opposing electrically conductive elements to said separated, and preferably opposing, ends of said at least on non-conductive element;
(iv) a quantity of said polycrystalline thermoelectric material sufficient to completely or approximately fill said three dimensional void in such a manner as to cause said pyroelectric material to be in intimate contact with the interior surfaces of said electrically conductive elements; and
(v) parts joining devices or materials selected from the group included but not limited to adhesives, screws, or welding sufficient to seal said pyroelectric material into said void in such a manner that said thermoelectric material does not leak or escape from said void A21. An apparatus for generating electrical potential or current as in A15 wherein said cohesive mass of polycrystalline thermoelectric material is affixed to a substrate comprised of an electrically conductive, heat resistant material, from the group including but not limited to, metal such as aluminum, copper, iron, steel, platinum, titanium, or semiconductor material such as, for instance, silicon oxide or gallium arsenide, singly or in any combination, or an electrically non-conductive or semiconductive heat resistant material, from the group including but not limited to, ceramic, glass, cementitious materials, or polymeric material, including but not limited to, silicone polymers, singly or in any combination.

A22. An apparatus for generating electrical potential or current as in A16 wherein said cohesive mass incorporates a binding material distributed throughout the entirety of the cohesive mass in a manner that causes approximately all the crystals of the polycrystalline mass to remain in intimate physical contact and electrically communicative throughout the entire volume of said cohesive mass of polycrystalline thermoelectric material, comprised of materials from the group comprised of safflower oil, linseed oil, vegetable oil, emulsions of water and oil, water, and water mixed with additives, or solvent based materials, including but not limited to, rubber, hide based adhesive material, or any combination thereof, in the mass of polycrystalline material distributed throughout the mass of said polycrystalline material in a manner that causes the crystals of the polycrystalline mass to remain electrically communicative throughout the entire volume of said cohesive mass of polycrystalline thermoelectric material, and said binding material is compressed and heated until the polymer is cured or said mass of polycrystalline thermoelectric material is consolidated sufficiently to permit handling or other processing.

A23. An apparatus for generating electrical potential or current as in A16 wherein said means of forming said thermoelectric material into a cohesive mass is causing said polycrystalline thermoelectric material to fill a three dimensional volume that is comprised of:
(i) At least two spatially separate, and preferably opposing, electrically conductive
(ii) At least one hollow, electrically non-conductive element capable of electrically and mechanically separating said at least two opposing electrically conductive elements, said at least one non-conductive element being capable of containing a hollow three dimensional void;
(iii) an enclosed three dimensional void formed within the assembly of said at least two opposing electrically conductive elements to said separated, and preferably opposing, ends of said at least on non-conductive element;
(iv) a quantity of said polycrystalline thermoelectric material sufficient to completely or approximately fill said three dimensional void in such a manner as to cause said pyroelectric material to be in intimate contact with the interior surfaces of said electrically conductive elements; and
(v) parts joining devices or materials selected from the group included but not limited to adhesives, screws, or welding sufficient to seal said pyroelectric material into said void in such a manner that said thermoelectric material does not leak or escape from said void.

A24. An apparatus for generating electrical potential or current as in A16 wherein said cohesive mass of polycrystalline thermoelectric material is affixed to a substrate comprised of an electrically conductive, heat resistant material, from the group including but not limited to, metal such as aluminum, copper, iron, steel, platinum, titanium, or semiconductor material such as, for instance, silicon oxide or gallium arsenide, singly or in any combination, or an electrically non-conductive or semiconductive heat resistant material, from the group including but not limited to, ceramic, glass, cementitious materials, or polymeric material, including but not limited to, silicone polymers, singly or in any combination.

A25. A method for generating electrical potential or current or both comprising the steps of:
(i) forming a quantity of polycrystalline pyroelectric or thermoelectric material into a cohesive mass capable of retaining its volume and shape by means of compression, heat, containment or any combination of the three;
(ii) embedding or affixing electrically conductive elements comprised of materials from the group including but not limited to, metallic or carbon conductors, wires, fibers, nanotubes or nanofibers, singly or in any combination on or into opposing regions, surfaces or facets of said cohesive mass of polycrystalline pyroelectric or thermoelectric material; and
(iii) applying heat or pressure or both until the mass of polycrystalline material is cohesive and consolidated.

A26. A method for generating electrical potential or current as in A25 wherein said cohesive mass of polycrystalline pyroelectric or thermoelectric material and the crystals therein is caused to have and retain a uniform electrical polarity by immersing said cohesive mass of pyroelectric or thermoelectric material which has had said conductors affixed or embedded into an electrical field simultaneously to the application of heat or pressure or both.

A27. A method for generating electrical potential or current as in A25, wherein said quantity of polycrystalline pyroelectric or thermoelectric material is polycrystalline Zinc Oxide.

A28. A method for generating electrical potential or current as in A26, wherein said quantity of polycrystalline pyroelectric or thermoelectric material is polycrystalline Zinc Oxide.

A29. A method for generating electrical potential or current as in A25 further comprising the steps of distributing a binding material throughout the entirety of the cohesive mass of polycrystalline material in sufficient quantity and under compression causing approximately all the crystals of the polycrystalline mass to remain in intimate physical contact and electrically communicative throughout the entire volume of said cohesive mass of polycrystalline material, said binding material being comprised of materials from the group including, but not limited to, safflower oil, linseed oil, vegetable oil, emulsions of water and oil, water, and water mixed with additives, or solvent based materials, including but not limited to, rubber, hide based adhesive material, or any combination thereof, and compressing and heating said binding material until the polymer is cured or polymerized, and consolidating said mass of polycrystalline pyroelectric material sufficiently to permit handling or other processing.

A30. A method for generating electrical potential or current as in A25 wherein said means of forming said pyroelectric material into a cohesive mass is causing said polycrystalline material to fill a three dimensional volume that is further comprises the steps of:
  (i) forming at least two spatially separate, and preferably opposing, electrically conductive elements;
  (ii) forming at least one hollow, electrically non-conductive element capable of electrically and mechanically separating said at least two opposing electrically conductive elements, said at least one non-conductive element being capable of containing a hollow three dimensional void;
  (iii) forming an enclosed three dimensional void by joining said at least two opposing electrically conductive elements to said separated, and preferably opposing, ends of said at least on non-conductive element; and
  (iv) filling said three dimensional void with said polycrystalline material in such a manner as to cause said polycrystalline material to be in intimate contact with the interior surfaces of said electrically conductive elements; and
  (v) sealing said polycrystalline material into said void in such a manner that said polycrystalline material does not leak or escape from said void.

A31. A method for generating electrical potential or current or both as in A25 further comprising the steps of affixing said cohesive mass of polycrystalline thermoelectric material to a substrate comprised of an electrically conductive, heat resistant material, selected from the group including but not limited to, metal such as aluminum, copper, iron, steel, platinum, titanium, or semiconductor material such as, for instance, silicon oxide or gallium arsenide, singly or in any combination, or an electrically non-conductive or semiconductive heat resistant material, selected from the group including but not limited to, ceramic, glass, cementitious materials, or polymeric material, including but not limited to, silicone polymers, singly or in any combination.

A32. A method for generating electrical potential or current or both as in A25 further comprising the steps of:
  (i) electrically connecting said cohesive mass of polycrystalline material to an electrical circuit via said electrical conductors affixed to or embedded into said cohesive mass of polycrystalline material;
  (ii) heating all or approximately all of said cohesive mass of polycrystalline material for a period of time sufficient for an electrical potential or current or both to reach a maximum value, thereby generating said electrical potential or current or both; and
  (iii) cooling all or approximately all of said cohesive mass of polycrystalline material for a period of time sufficient for said electrical potential or current or both to reach a minimum or negative value, thereby generating an electrical potential or current or both that is opposite to the current generated by heating said cohesive mass of polycrystalline material.

A33. A method for generating electrical potential or current or both as in A26 further comprising the step of:
  (i) electrically connecting said cohesive mass of polycrystalline material to an electrical circuit via said electrical conductors affixed to or embedded into said cohesive mass of polycrystalline material;
  (ii) heating all or approximately all of said cohesive mass of polycrystalline material for a period of time sufficient for an electrical potential or current or both to reach a maximum value, thereby generating an electrical potential or current or both; and
  (iii) cooling all or approximately all of said cohesive mass of polycrystalline material for a period of time sufficient for said electrical potential or current or both to reach a minimum or negative value, thereby generating an electrical potential or current or both that is opposite to the current generated by heating said cohesive mass of polycrystalline material.

A34. A method for generating electrical potential or current or both as in A32 wherein said cohesive mass of polycrystalline material is zinc oxide.

A35. A method for generating electrical potential or current or both as in A33 wherein said cohesive mass of polycrystalline material is zinc oxide.

A36. A method for generating electrical potential or current or both as in A25 further comprising the steps of:
  (i) electrically connecting said cohesive mass of polycrystalline material to an electrical circuit via said electrical conductors affixed to or embedded into said cohesive mass of polycrystalline material;
  (ii) heating a portion of said cohesive mass of polycrystalline material for a continuous period of time sufficient, and cooling a spatially opposed portion of said cohesive polycrystalline material for the same continuous period of time, thereby causing a thermal differential over the mass of polycrystalline material and generating an electrical potential or current or both.

A37. A method for generating electrical potential or current or both as in A26 further comprising the steps of:
  (i) electrically connecting said cohesive mass of polycrystalline material to an electrical circuit via said electrical conductors affixed to or embedded into said cohesive mass of polycrystalline material;
  (ii) heating a portion of said cohesive mass of polycrystalline material for a continuous period of time sufficient, and cooling a spatially opposed portion of said cohesive polycrystalline material for the same continuous period of time, thereby causing a thermal differential over the mass of polycrystalline material and generating an electrical potential or current or both.

A38. A method for generating electrical potential or current or both as in A36 wherein said cohesive mass of polycrystalline material is zinc oxide.

A39. A method for generating electrical potential or current or both as in A37 wherein said cohesive mass of polycrystalline material is zinc oxide.

I claim:

1. A method for generating electrical potential or current or both through a pyroelectric process comprising the steps of:
   forming a cohesive mass of polycrystalline zinc oxide crystals into a lozenge or tablet shape with dimensions of at least 1.0 inch×1.0 inch×0.18 inch and electrically conductive elements embedded or affixed on or into opposing regions, surfaces, or facets of the cohesive mass, and causing the polycrystalline zinc oxide crystals in the cohesive mass to remain in intimate physical contact and to remain electrically communicative with each other;
   electrically connecting the cohesive mass of polycrystalline zinc oxide crystals to an electrical circuit via said electrically conductive elements;
   heating said cohesive mass of polycrystalline zinc oxide crystals for a first period of time and then cooling said cohesive mass for a second period of time to generate an electrical potential or current or both through the pyroelectric process.

2. The method of claim 1, further comprising causing the cohesive mass and the polycrystalline zinc oxide crystals in the cohesive mass to have a uniform electrical polarity by immersing said cohesive mass into an electrical field simultaneously to applying heat or pressure or both to the cohesive mass.

3. The method of claim 1, wherein the electrically conductive elements are comprised of materials selected from the group consisting of metallic or carbon conductors, wires, fibers, nanotubes or nanofibers, singly or in any combination.

4. The method of claim 1, further comprising forming a pyroelectric element having a non-conductive shell and the cohesive mass of polycrystalline zinc oxide crystals encapsulated within a cavity of the non-conductive shell, the electrically conductive elements extending from opposing ends of the non-conductive shell.

5. The method of claim 4, wherein the electrically conductive elements are fabricated in sufficient size and shape so as to completely close the opposing ends of the non-conductive shell.

6. The method of claim 1, further comprising affixing the cohesive mass of polycrystalline zinc oxide crystals to a heat resistant substrate selected from the group consisting of an electrically conductive material including aluminum, copper, iron, steel, platinum, titanium, a semiconductor material including silicon oxide or gallium arsenide, singly or in combination, and an electrically non-conductive or semiconductive material including ceramic, glass, cementitious materials, polymeric material, including silicone polymers, singly or in any combination.

7. The method of claim 1, further comprising forming the cohesive mass of polycrystalline zinc oxide crystals by:
   mixing a quantity of polycrystalline zinc oxide in a powder form with an oil to form a polycrystalline ZnO powder-oil mixture;
   forming the polycrystalline ZnO powder-oil mixture into a shaped mass;
   embedding or affixing electrically conductive elements on or into opposing regions, surfaces, or facets of the shaped mass; and
   heating the shaped mass to a temperature in the range of 212° F. (100° C.) to 3587° F. (1975° C.) until the oil is substantially eliminated from the shaped mass leaving a cohesive mass of polycrystalline zinc oxide crystals.

8. The method of claim 7, wherein the oil is selected from the group consisting of safflower oil, linseed oil, vegetable oil, emulsions of water and oil, water, and water mixed with additives, solvent based materials such as rubber, hide based adhesive material, or any combination thereof.

9. The method of claim 1, wherein the cohesive mass of polycrystalline ZnO crystals is formed by compression, heat, containment or any combination of the three to retain its volume and shape.

10. An apparatus for generating electrical potential or current or both through a pyroelectric process comprising:
    a cohesive mass of polycrystalline zinc oxide crystals having a lozenge or tablet shape with dimensions of at least 1.0 inch×1.0 inch×0.18 inch and electrically conductive elements embedded or affixed on or into opposing regions, surfaces, or facets of the shaped mass, the electrically conductive elements connected to an electrical circuit, the polycrystalline zinc oxide crystals being positioned in the cohesive mass to remain in intimate physical contact and to remain electrically communicative with each other;
    a heating element arranged to heat said cohesive mass of polycrystalline zinc oxide crystals for a first period of time; and
    a cooling element arranged to cool said cohesive mass for a second period of time to generate an electrical potential or current or both through the pyroelectric process.

11. The apparatus of claim 10, wherein the cohesive mass and the polycrystalline zinc oxide crystals in the cohesive mass have a uniform electrical polarity.

12. The apparatus of claim 11, further comprising an electric field generator to generate an electric field in which the cohesive mass is immersed simultaneously to applying heat or pressure or both to the cohesive mass.

13. The apparatus of claim 10, wherein the electrically conductive elements are comprised of materials selected from the group consisting of metallic or carbon conductors, wires, fibers, nanotubes or nanofibers, singly or in any combination.

14. The apparatus of claim 10, further comprising a pyroelectric element having a non-conductive shell, the cohesive mass of zinc oxide crystals encapsulated within a cavity of the non-conductive shell, the electrically conductive elements extending from opposing ends of the non-conductive shell.

15. The apparatus of claim 14, wherein the electrically conductive elements are fabricated in sufficient size and shape so as to completely close the opposing ends of the non-conductive shell.

16. The apparatus of claim 10, wherein the cohesive mass of polycrystalline zinc oxide crystals is affixed to a heat resistant substrate selected from the group consisting of an electrically conductive material including aluminum, copper, iron, steel, platinum, titanium, a semiconductor material including silicon oxide or gallium arsenide, singly or in combination, and an electrically non-conductive or semiconductive material including ceramic, glass, cementitious materials, polymeric material, including silicone polymers, singly or in any combination.

17. The apparatus of claim 10, wherein the cohesive mass is formed with an oil selected from the group consisting of safflower oil, linseed oil, vegetable oil, emulsions of water and oil, water, and water mixed with additives, solvent based materials such as rubber, hide based adhesive material, or any combination thereof.

18. The apparatus of claim 10, wherein the cohesive mass of polycrystalline ZnO crystals is capable of retaining its volume and shape by means of compression, heat, containment or any combination of the three.

\* \* \* \* \*